US006243567B1

United States Patent
Saito

(10) Patent No.: US 6,243,567 B1
(45) Date of Patent: Jun. 5, 2001

(54) TELEVISION TUNER, TUNER INTEGRATED CIRCUIT AND METHOD OF CONTROLLING TELEVISION TUNER

(75) Inventor: Hitoshi Saito, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/160,237

(22) Filed: Sep. 25, 1998

(30) Foreign Application Priority Data

Sep. 30, 1997 (JP) .................................................. 9-266467

(51) Int. Cl.[7] ...................................................... H04B 1/18
(52) U.S. Cl. ................................ 455/188.2; 455/180.2; 348/731
(58) Field of Search .............................. 455/188.2, 188.1, 455/176.1, 189.1, 190.1, 179.1, 180.1, 180.2; 348/731, 732, 733

(56) References Cited

U.S. PATENT DOCUMENTS

| 4,461,038 | * | 7/1984 | Miyoshi | 455/176.1 |
| 4,982,444 | * | 1/1991 | Matsuura | 455/188.2 |
| 5,122,878 | * | 6/1992 | Heigl et al. | 348/731 |
| 5,126,848 | | 6/1992 | Sim . | |
| 5,212,828 | | 5/1993 | Hatashita et al. . | |
| 5,821,838 | * | 10/1998 | Suzuki et al. | 455/188.2 |
| 5,983,088 | * | 11/1999 | Aschwanden | 455/188.2 |
| 6,108,050 | * | 8/2000 | Yamamoto et al. | 348/731 |

FOREIGN PATENT DOCUMENTS 1-007370   11/1989  (EP) .
2 239 362    6/1991  (GB) .

OTHER PUBLICATIONS

"Semiconductors for Television and Video Systems", 1998, Philips Semiconductors, Eindhoven, NL XP002089470, Mar. 6, 1997, pp. 190–194.
European Search Report dated Jan. 22, 1999.
Philips Data Sheet, TDA6402; TDA6403; TDA6403A, 5V mixers/oscillators and synthesizers for cable TV and VCR 2–band tuners, Mar. 6, 1997, pp. 1–40.

* cited by examiner

Primary Examiner—Nay Maung
Assistant Examiner—Quochien Vuong
(74) Attorney, Agent, or Firm—McGinn & Gibb, PLLC

(57) ABSTRACT

There is provided a television tuner including a first amplifier for amplifying received signals having frequencies of VHF-L and VHF-H bands, a first converter for converting a frequency of the received signals having been amplified by the first amplifier, a second amplifier for amplifying a received signal having a frequency of UHF band, a second converter for converting a frequency of the received signal having been amplified by the second amplifier, a signal transmitter for transmitting an operation switching signal by which the VHF-L band, the VHF-H band, or the UHF band is selected, a detector for detecting that none of the VHF-L and VHF-H bands is selected, based on data about the VHF-L and VHF-H bands, represented by the operation switching signal, and a driver for driving the second amplifier and pausing the first amplifier when the detector detects that none of the VHF-L and VHF-H bands is selected, and pausing the second amplifier and driving the first amplifier when the detector detects that one of the VHF-L and VHF-H bands is selected.

37 Claims, 7 Drawing Sheets

FIG. 1
PRIOR ART

TELEVISION TUNER, TUNER INTEGRATED CIRCUIT AND METHOD OF CONTROLLING TELEVISION TUNER

BACKGROUND OF THE INVENTION

1. Field of the Invention

The invention relates to a television tuner switching a mode between UHF and VHF modes to thereby receive signals having frequencies of UHF and VHF bands, a tuner integrated circuit (IC) for controlling operation modes of such a television tuner, and a method of controlling a television tuner.

2. Description of the Related Art

In general, three frequency bands are now utilized as radio wave for television broadcasting: Very High Frequency-Low (VHF-L) band; Very High Frequency-High (VHF-H) band; and Ultra High Frequency (UHF) band.

A so-called television tuner has conventionally selected a channel by means of a logical channel (LC) tuning circuit. However, it is quite difficult to cover the above-mentioned three bands by a single LC tuning circuit. Hence, a conventional television tuner has been designed to include three LC tuning circuits each associated with the above-mentioned three bands, which LC tuning circuits are alternately switched. This is the same in a LC oscillation circuit of a frequency converter.

In the United States, a frequency band for FM radio broadcasting is positioned between VHF-L and VHF-H bands for television broadcasting. Hence, when radio waves for television broadcasting in VHF-L and VHF-H bands are to be received, radio waves for radio broadcasting in FM band may interfere with them to thereby degrade images and/or sound in quality. In order to avoid such interference, it would be necessary to trap radio waves for radio broadcasting in FM band.

In cable television service now spreading in the United States, a frequency band of signals for cable television is almost the same as a frequency band of signals for radio wave for television broadcasting, but is assigned FM band used for radio broadcasting. Hence, when a cable television is in operation, it is impossible to trap FM band.

Hence, in a television tuner available in the United States, a FM trap circuit for trapping signals of FM band is connected to an antenna through which radio waves for television broadcasting are received. The FM trap circuit is operated when radio waves for television broadcasting in VHF-L and VHF-H bands are to be received, and is paused when signals of a cable television are to be received through a cable.

A television tuner now available is not designed to switch only a LC tuning circuit in order to switch signals to be received between VHF-L and VHF-H bands, and UHF band. Circuits for amplifying high frequency and circuits for converting frequency separately prepared for VHF-L and VHF-H bands, and UHF band are connected to a front stage of a LC tuning circuit to thereby define a circuit for receiving signals having a frequency of VHF-L and VHF-H bands, and a circuit for receiving signals having a frequency of UHF band. The thus defined circuits are wholly, selectively switched.

The television tuner having such a structure as mentioned above makes it possible to simplify a circuit structure thereof, suppress degradation in characteristics, and optimize noise figure (NF) and operation current of transistors constituting the circuit, in accordance with a band. The above-mentioned control for switching circuits for receiving signals having frequencies of VHF-L and -H bands, and UHF band is generally carried out by means of operation switching signals standardized by a micro-computer, using an integrated injection logic (IIL) gate as standard specification.

An example of conventional television tuners is explained hereinbelow with reference to FIGS. 1, 2A and 2B, wherein FIG. 1 is a block diagram of a television tuner, FIG. 2A is a partial block diagram of a tuner integrated circuit, and FIG. 2B illustrates data for switching a band.

As illustrated in FIG. 1, the illustrated television tuner 1 is comprised of a high frequency amplifying section 100, a tuner integrated circuit 200, a logical channel (LC) section 300, and a control circuit 400.

The high frequency amplifying section 100 amplifies signals for radio wave or cable television broadcasting. The tuner IC 200 converts the amplified television signals into an intermediate frequency. The control circuit 400 is comprised of a microcomputer in which a suitable control program is installed as software, and controls operation of the high frequency amplifying section 100 and the tuner IC 200.

The tuner IC 200 includes a frequency converter 2 to which a tuner controller 3 is connected. The high frequency amplifying section 100 includes a first amplifier 4 for amplifying a frequency of UHF band, and a second amplifier 5 for amplifying frequencies of VHF-L and -H bands. The first and second amplifiers 4 and 5 are connected upstream to the frequency converter 2. A FM trap circuit 6 is connected upstream to the second amplifier 5.

The FM trap circuit 6 to which the second amplifier 5 is connected, and the first amplifier 4 are both connected to a switch device 7, to which an antenna (not illustrated) for receiving radio wave broadcasting or a communication cable (not illustrated) for cable broadcasting is connected through an input terminal 8.

The frequency converter 2 includes a first frequency mixer 11 for UHF band and a second frequency mixer 12 for VHF-L and -H bands, which are connected to a first local oscillator (LO) 13 for UHF band and a second local oscillator (LO) 14 for VHF-L and -H bands, respectively.

The first and second local oscillators 13 and 14 are connected to a phase locked loop (PLL) section 15 through a buffer amplifier 19. The phase locked loop section 15 is connected to the first and second local oscillators 13 and 14 for feedback through logical channels 16 and 17 for UHF band, and VHF-L and -H bands, respectively, in the logical channel section 300.

As mentioned above, the first and second amplifiers 4 and 5, the first and second mixers 11 and 12, the first and second local oscillators 13 and 14, and the first and second logical channels 16 and 17 are equipped separately for UHF band, and VHF-L and -H bands, and are connected in series to thereby define a first circuit 500 for receiving signals having a frequency of UHF band, and a second circuit 600 for receiving signals having a frequency of VHF-L and -H bands.

The first and second local oscillators 13 and 14 oscillate at certain frequencies. The first and second mixers 11 and 12 convert frequencies of television signals in UHF band and VHF-L and -H bands into intermediate frequencies by mixing them with frequencies of oscillation made by the first and second local oscillators 13 and 14. The phase locked loop section 15 outputs a control voltage to the first and second logical channels 16 and 17 in accordance with the oscillation frequencies of the first and second local oscillators 13 and 14, respectively, and cooperates with the first and second logical channels 16 and 17 to control oscillation frequencies of the first and second local oscillators 13 and 14 by feed-back.

As illustrated in FIG. 1, the phase locked loop section 15 is comprised of a frequency divider 41, a phase detector 42, a standard oscillator 43, a charge pump 44, and a buffer amplifier 45. The frequency divider 41 divides a local oscillation signal transmitted from the buffer amplifier 19. The standard oscillator 43 transmits an oscillation signal having a certain frequency.

The phase detector 42 generates a voltage proportional to a difference in phase between a frequency division signal transmitted by the frequency divider 41 and the oscillation signal transmitted from the standard oscillator 43.

The charge pump 44 increases an output voltage of the phase detector 42 up to a certain voltage. The buffer amplifier 45 removes high frequency parts out of the thus increased voltage, and outputs the resultant voltage to the first and second logical channels 16 and 17 as a control voltage.

The frequency divider 41 can vary a division ratio in accordance with a signal transmitted from the control circuit 400 in order to conform to a received channel. Hence, an output signal transmitted from the frequency divider 41 has a certain frequency regardless of a frequency of a received signal.

The standard oscillator 43 can vary its oscillation frequency in accordance with the control signal transmitted from the control circuit 400 in order to conform to a band and/or channel interval of various areas.

An UV switching buffer 18 is connected to the first and second mixers 11 and 12, and is connected further to a tuner control section 3. The tuner control section 3 includes a band switching buffer 21 which is provided with output terminals P1, P2, P3, and P4 arranged in a row in this order. Control signals for VHF-L band, VHF-H band, FM band, and UHF band are transmitted through the output terminals P1, P2, P3, and P4.

The output terminal for UHF band is connected to the first amplifier 4 used for UHF band. The output terminals P1 and P2 for VHF-L and VHF-H bands, respectively, are both connected to the second amplifier used for VHF-L and VHF-H bands. The output terminal P4 for UHF band is connected not only to the first amplifier 4, but also to the UV switching buffer 18.

The band switching buffer 21 is connected to a data converter 22, to which the phase locked loop section 15 and the control circuit 400 are connected. More specifically, as illustrated in FIG. 2A, the control circuit 400 is connected to the data converter 22 through an IIC bus 23 including a data input wiring 24 and a clock input wiring 25. These input wirings 24 and 25 are connected to a serial-parallel converter 26 of the data converter 22.

The serial-parallel converter 26 is comprised of eight D-type flip-flop circuits 27 to 35 which are electrically connected in serial to each other so that an input terminal of a flip-flop circuit located upstream is connected to a normal output terminal of a flip-flop circuit located downstream. Normal output terminals of the first four flip-flop circuits 27, 28, 29 and 30 of the serial-parallel converter 26 are connected in parallel to input terminals of the remaining four flip-flop circuits 32, 33, 34, and 35 constituting a data latch circuit 31. A 8-clock counter 36 connected to the clock input wiring 25 is connected to controls terminals of the four flip-flop circuits 32, 33, 34, and 35 constituting the data latch circuit 31.

Normal output terminals of the four flip-flop circuits 32, 33, 34, and 35 are connected in parallel to a four-bit band switching buffer 37. Four bit buffers equipped with the band switching buffer 37 are connected to the output terminals P1, P2, P3 and P4 through which the control signals for UHF band, FM band, VHF-H band, and VHF-L band are transmitted.

Though detailed later, 8-bit operation switching signals by each of which indicates as one-bit data that VHF-L band, VHF-H band, UHF band, or none of them is selected are input in serial to the serial-parallel converter 26 of the tuner controller 3 from the control circuit 400. The band switching buffer 37 of the tuner controller 3 transmits at least four-bit operation switching signals in parallel by each of which indicates as one-bit data that VHF-L band, VHF-H band, UHF band, or none of them is selected.

As illustrated in FIG. 2A, the band switching buffer 37 includes first, second, third and fourth bit buffers B1, B2, B3, and B4. The first and second bit buffers B1 and B2 retaining setting data D1 and D2 about VHF-L band and VHF-H band, respectively, are connected to the second amplifier 5 used for VHF-L and VHF-H bands. The third bit buffer B3 retaining setting data D3 about FM band is connected to the FM trap circuit 6. The fourth bit buffer B4 retaining setting data D4 about UHF band is connected to the first amplifier 4 used for UHF band, and further to the UV switching buffer 18 of the frequency converter 2 through a control output wiring 38.

The first and second bit buffers B1 and B2 of the band switching buffer 37 are connected further to the second amplifier used for VHF-L and -H bands. The fourth bit buffer B4 is connected to the first amplifier 4, and further to the second amplifier 5 through an inverter. That is, one of the first and second amplifiers 4 and 5 operates in accordance with whether the setting data D4 about UHF band is selected or not. The second amplifier 5 used for VHF-L and -H bands switches tuning frequency band of a built-in LC tuning circuit (not illustrated) between VHF-L band and VHF-H band in accordance with the setting data D1 and D2 about VHF-L band and VHF-H band, respectively.

The television tuner 1 having the above-mentioned structure is used for receiving television radio waves in the United States, for instance. In the United States, since FM band of radio waves used for radio broadcasting is assigned between VHF-H and VHF-L bands, it is necessary to trap FM band in order to avoid interference when radio waves in VHF-H and -L bands are to be received.

On the other hand, a frequency band for transmission signals of a cable television is almost the same as the above-mentioned frequency band of a television ground wave. However, since a channel of the frequency band for transmission signals of a cable television is assigned also to FM band, it is not possible to trap FM band when cable television signals are to be received. Hence, the television tuner 1 turns on the FM trap circuit 6 for trapping FM band or turns off the FM trap circuit 6 for pausing to trap FM band by the tuner controller 3 in accordance with whether radio waves in VHF-L and -H bands or cable signals of a cable television are received.

The above-mentioned radio waves for television broadcasting and wired signals for a cable television cover from VHF-L and -H bands to UHF band. For this reason, it is quite difficult to use a hardware for both UHF band, and VHF-L and -H bands. Specifically, the frequency converter 2 can receive signals having frequency ranging from UHF band to VHF-L and -H bands. However, since it is necessary to switch operation modes for receiving signals in UHF band and VHF-L and -H bands, the tuner controller 3 carries out such switching.

In more detail, as illustrated in FIG. 2B, 8-bit operation switching signals including data "X, X, X, X, U, FM, VH, VL" (indicates any data) each of which indicates VHF-L band, VHF-H band, FM band, UHF band, or none of them is selected, are input in serial in this order to the data input wiring 24 of the tuner controller 3 from the control circuit 400.

Since the operation switching signals are serially input to the data input wiring 24 in synchronization with clock signals, at a time when an eighth clock signal has been input, the last four-bit data "U, FM, VH, VL" in the 8-bit operation switching signals is retained in the first to fourth flip-flop circuits 27 to 30 of the serial-parallel converter 26, respectively.

When the eighth clock signal has been input to the data input wiring 24 as mentioned earlier, the 8-clock counter 36 which repeats counting clock signals transmits a latch signal to the data latch circuit 31. Hence, the last four-bit data "U, FM, VH, VL" in the 8-bit operation switching signals, retained in the flip-flop circuits 27 to 30, are transferred in parallel to the four flip-flop circuits 32 to 35 of the data latch circuit 31, and retained therein.

The four-bit operation switching signals converted into parallel data are individually retained in the flip-flop circuits 32 to 35 of the data latch circuit 31, and then, input in parallel to the four bit buffers B1, B2, B3 and B4 of the band switching buffer 37. The parallel four-bit operation switching signals transmitted to the band switching buffer 37 indicates in each bit whether VHF-H band, VHF-L band, FM band, or UHF band is selected.

For instance, if UHF band is selected as a band for receiving signals, only the setting data for UHF band is set to be "1", and other setting data for VHF-H, VHF-L and FM bands are set to be "0". The band switching buffer 37 transmits control signals to the frequency converter 2 through the control output wiring 38 in accordance with the setting data for UHF band which is input to the fourth bit buffer B4.

The frequency converter 2 receives the control signals, as mentioned above. The UV switching buffer 18 switches the first and second mixers 11 and 12, and the first and second local oscillators 13 and 14 in accordance with the control signals input thereto. As a result, an operation mode of the television tuner 1 is switched between VHF mode used for receiving signals having a frequency in VHF-L and -H bands, and UHF mode used for receiving signals having a frequency in UHF band.

As mentioned above, there are generated the operation switching signals for both VHF-L and -H bands for the purpose of switching a tuning frequency of the second amplifier to be used for VHF-L and -H bands. However, since switching between VHF and UHF modes is carried out in accordance with whether the setting data about UHF band indicates that UHF band is selected, VHF mode can be selected regardless of which one of the setting data about VHF-H and -L bands is selected.

The setting data about FM band is inevitably selected only when wired signals for a cable television are to be received, and is not selected when radio waves for television broadcasting are to be received. Hence, the FM trap circuit 6 to which the setting data about FM band is transmitted as a control signal from the band switching buffer 21 is designed not to trap FM band when the setting data about FM band indicates that FM band is selected, but trap FM band when the setting data indicates that FM band is not selected.

Thus, since FM band is trapped when radio waves for television broadcasting are received, radio waves in VHF-L and -H bands adjacent to FM band are well received by the second circuit 600. In addition, since FM band is not trapped when wired signals for a cable television are received, wired signals in FM band can be well received by the second circuit 600.

As the tuner IC 200 operating in such a manner as mentioned above, there may be employed TDA 6402A commercially available from Philips Ltd. (Philips data sheet, TDA 6402A, TDA 6403, TDA 6403A, Mar. 6, 1997).

In the above-mentioned television tuner 1, since the tuner controller 3 switches operation modes of the frequency converter 2 in accordance with the operation switching signals transmitted from the control circuit 400, the frequency converter 2 can receive UHF and VHF signals.

However, some television tuners are designed to have a different arrangement of the first and second amplifiers 4 and 5, and the FM trap circuit 6 from the arrangement of those in the television tuner 1 illustrated in FIG. 1. In such television tuners, data wirings connecting the band switching buffer 37 to the frequency converter 2 intersect with each other.

Data wirings for a television tuner are generally patterned on a printed wiring board. In order to intersect data wirings with each other as mentioned above, it would be necessary to form a wiring pattern in a multi-layered structure, or make jumper wirings, either of which would significantly lower a fabrication yield of a television tuner.

Hence, in order to avoid intersection of data wirings, a television tuner having such a layout as mentioned above changes an order of setting data about UHF and FM bands in the operation switching signals. As a result, the control signals are transmitted from the tuner controller 3 to the frequency converter 2 in accordance with the setting data about FM band in the operation switching signals.

For instance, when the frequency converter 2 and the tuner controller 3 are constituted of separate parts, what is necessary to do is merely to adjust a wiring structure. However, when the frequency converter 2 and the tuner controller 3 are constituted of the single tuner IC 200, it is quite difficult to adjust a wiring structure in accordance with a format of the operation switching signals.

In order to solve such a problem, there has been suggested a tuner IC which can conform to the above-mentioned format of the operation switching signals. FIG. 3 illustrates such a tuner IC 700. In the illustrated tuner IC 700, the third bit buffer B3 of the band switching buffer 37 is directly connected to the UV switching buffer 18 through the control output wiring 38. As a tuner IC having such a structure as illustrated in FIG. 3, there is TDA 6402 commercially available from Philips Ltd.

That is, there has been used two kinds of formats of the operation switching signals to conform to two layouts of television tuners. As a result, there has been prepared two kinds of tuner ICs in accordance with the two kinds of the operation switching signals. Specifically, there has been prepared TDA 6402 and TDA 6402A both of which are commercially available from Philips Ltd., as the tuner ICs 200 and 700, respectively.

As a result, fabrication yields for the tuner ICs 200 and 700 have remained low, and in addition, the number of fabrication steps and load on stock control has been increased. The above-mentioned two kinds of tuner ICs such as the tuner ICs 200 and 700 are generally designed to have the same appearance in order to keep compatibility in a mold for making a resin package and/or in a shape of a connector, which is accompanied with a problem that the tuner IC 200 or 700 may be incorporated into an inappropriate television tuner.

SUMMARY OF THE INVENTION

In view of the above-mentioned problems of the conventional television tuners, it is an object of the present invention to provide a television tuner which is capable of conforming to two kinds of formats of operation switching signals. It is also an object of the present invention to provide a tuner IC used for the above-mentioned television tuner, a method of controlling the above-mentioned television tuner, and a recording medium for causing a computer to act as the above-mentioned television tuner.

In one aspect of the present invention, there is provided a television tuner including (a) a first signal receiver for receiving signals having frequencies of VHF-L and VHF-H bands, (b) a second signal receiver for receiving signals having a frequency of UHF band, (c) a third signal receiver for receiving operation switching signals by each of which the VHF-L band, the VHF-H band, or the UHF band is selected, (d) a detector for detecting that none of the VHF-L and VHF-H bands is selected, based on data about the VHF-L and VHF-H bands, represented by the operation switching signals, and (e) a driver for driving the second signal receiver when the detector detects none of the VHF-L and VHF-H bands is selected.

In the above-mentioned television tuner, signals having frequencies of VHF-L and VHF-H bands are received by the first signal receiver, and signals having a frequency of UHF band are received by the second signal receiver. The operation switching signals by each of which the VHF-L band, the VHF-H band, or the UHF band is selected are received by the third signal receiver. If the detector detects none of VHF-L and VHF-H bands are selected, based on setting data about them, the second signal receiver is selectively operated by the operation switching signal indicating the detection result of the detector. Hence, even if the setting data about UHF band is altered in position in an operation switching signal, the second signal receiver is selectively operated or not operated, only based on the setting data about VHF-L and -H bands, regardless of alteration in position of the setting data about UHF band.

It should be noted that any parts constituting the above-mentioned television tuner might be formed so as to accomplish a function to be required. For instance, as mentioned later, there may be employed a specific hardware, a computer to which required functions are given by means of a program, functions accomplished in a computer by means of a suitable program, and a combination thereof.

The operation switching signal may be constituted as at least four-bit stream by each of which the VHF-L band, the VHF-H band, or the UHF band is selected, and may include two formats where the setting data about UHF and FM bands are exchanged in position.

For instance, the second signal receiver may include (b-1) a local oscillator which makes oscillation at a certain frequency, and (b-2) a frequency mixer for mixing an oscillation frequency of the local oscillator and a frequency of received signals, and converting the thus mixed frequencies into an intermediate frequency.

The local oscillator oscillates at a certain frequency, which is mixed with a frequency of a received signal, by the frequency mixer, to thereby convert into an intermediate frequency. Thus, a signal having a frequency in UHF band can be processed in the same manner as a signal having a frequency in VHF-L and -H bands.

There is further provided a television tuner including (a) a first amplifier for amplifying received signals having frequencies of VHF-L and VHF-H bands, (b) a first converter for converting a frequency of the received signals having been amplified by the first amplifier, (c) a second amplifier for amplifying a received signal having a frequency of UHF band, (d) a second converter for converting a frequency of the received signal having been amplified by the second amplifier, (e) a signal transmitter for transmitting an operation switching signal by which the VHF-L band, the VHF-H band, or the UHF band is selected, (f) a detector for detecting that none of the VHF-L and VHF-H bands is selected, based on data about the VHF-L and VHF-H bands, represented by the operation switching signal, and (g) a driver for driving the second amplifier and pausing the first amplifier when the detector detects that none of the VHF-L and VHF-H bands is selected, and pausing the second amplifier and driving the first amplifier when the detector detects that one of the VHF-L and VHF-H bands is selected.

In the above-mentioned television tuner, received signals having a frequency in VHF-L and -H bands are amplified by the first amplifier, and a frequency of the thus amplified signals is converted by the first converter. Similarly, received signals having a frequency in UHF band are amplified by the second amplifier, and a frequency of the thus amplified signals is converted by the second converter. The signal transmitter transmits the operation switching signals by each of which the VHF-L band, the VHF-H band, or the UHF band is selected. If the detector detects that none of VHF-L and VHF-H bands are selected, based on setting data about them, the driver drives the second amplifier and pauses the first amplifier. On the other hand, if the detector detects that one of the VHF-L and VHF-H bands is selected, the driver pauses the second amplifier and drives the first amplifier. Hence, even if the setting data about UHF band is altered in position in an operation switching signal, the first or second amplifier is selectively operated, only based on the setting data about VHF-L and -H bands, regardless of alteration in position of the setting data about UHF band.

For instance, the driver is comprised a first driver and a second driver, the first driver driving the second amplifier and pausing the first amplifier when the detector detects that none of the VHF-L and VHF-H bands is selected, the second driver pausing the second amplifier and driving the first amplifier when the detector detects that one of the VHF-L and VHF-H bands is selected.

In another aspect of the present invention, there is provided a tuner integrated circuit to be used for a television tuner including VHF mode for receiving a signal having a frequency of VHF-L and VHF-H bands, and UHF mode for receiving a signal having a frequency of UHF band, the tuner integrated circuit including (a) a signal receiver for serially receiving operation switching signals by each of which the VHF-L band, the VHF-H band, or the UHF band is selected, (b) a data converter for converting the operation switching signals serially received in the signal receiver into parallel signals, (c) a logical multiplier for logically multiplying binary data about the VHF-L and VHF-H bands, represented by the operation switching signals, and (d) a switching device for switching a mode of the television tuner between the UHF and VHF modes in accordance with a logical product provided by the logical multiplier.

The above-mentioned tuner integrated circuit may further include a data retainer for retaining the parallel signals therein.

Operation switching signals by each of which the VHF-L band, the VHF-H band, or the UHF band is selected are input in serial to the signal receiver. Then, the operation switching signals are converted by the data converter into parallel signals, and retained in the data retainer. The thus retained binary setting data about VHF-L and -H data in the operation switching signals are logically multiplied by the logical multiplier. A mode of a television tuner is switched by the switching device between UHF and VHF modes in accordance with the thus obtained logical product. Hence, even if the setting data about UHF and FM bands are altered in position in an operation switching signal, a mode in a television tuner is switched between UHF and VHF modes in accordance with the setting data about VHF-L and -H bands, regardless of alteration in position of the setting data about UHF and FM bands.

There is further provided a tuner integrated circuit to be used for a television tuner including VHF mode for receiving a signal having a frequency of VHF-L and VHF-H bands, and UHF mode for receiving a signal having a frequency of UHF band, the tuner integrated circuit including (a) a signal receiver for serially receiving operation switching signals by each of which the VHF-L band, the VHF-H band, or the UHF band is selected, (b) a data converter for converting the operation switching signals serially received in the signal receiver into parallel signals, (c) a wired AND for logically multiplying inverted outputs transmitted from the data converter, (d) a first integrated injection logic gate for inverting a logical product transmitted from the wired AND, (e) a second integrated injection logic gate for inverting data transmitted from the first integrated injection logic gate, and (f) a switching buffer for switching a mode of the television tuner between the UHF and VHF modes in accordance with an output transmitted from the second integrated injection logic gate.

The above-mentioned tuner integrated circuit may further include a data latch circuit for retaining the parallel signals therein.

It is preferable that each of the operation switching signals includes at least four-bit data each of which is indicative of whether the VHF-L band, the VHF-H band, or the UHF band is selected, in which case, the data latch circuit preferably includes at least four flip-flop circuits.

It is preferable that inverted outputs transmitted from first and second flip-flop circuits among the flip-flop circuits are logically multiplied by the wired AND.

Operation switching signals by each of which the VHF-L band, the VHF-H band, or the UHF band is selected are input in serial to the signal receiver. Then, the operation switching signals are converted by the data converter into parallel signals, and retained in the flip-flop circuits constituting the data retainer, for instance. Inverted outputs transmitted from first and second flip-flop circuits among the flip-flop circuits are logically multiplied by the wired AND, and the thus logically multiplied setting data is twice inverted by the first and second integrated injection logic gates, and then, input into the switching buffer. The switching buffer outputs control signals through a control output wiring in accordance with the setting data transmitted thereto. The control signals are input into a television tuner. Hence, even if the setting data about UHF and FM bands are altered in position in an operation switching signal, a mode in a television tuner is switched between UHF and VHF modes in accordance with the setting data about VHF-L and -H bands, regardless of alteration in position of the setting data about UHF and FM bands.

The term "inverted output" of the flip-flop circuits means an output terminal through which binary data which was input through an input terminal and inverted is output. The term "normal output" means an output terminal through which binary data which was input through an input terminal, but not inverted is output.

There is still further provided a tuner integrated circuit to be used for a television tuner including VHF mode for receiving a signal having a frequency of VHF-L and VHF-H bands, and UHF mode for receiving a signal having a frequency of UHF band, the tuner integrated circuit including (a) a signal receiver for serially receiving operation switching signals each including at least four-bit data each of which is indicative of whether the VHF-L band, the VHF-H band, or the UHF band is selected, (b) a data converter for converting the operation switching signals serially received in the signal receiver into parallel signals, (c) a data latch circuit including at least four flip-flop circuits for retaining the parallel signals therein, (d) a first integrated injection logic gate for inverting a normal output transmitted from a first flip-flop circuit among the flip-flop circuits, (e) a second integrated injection logic gate for inverting a normal output transmitted from a second flip-flop circuit among the flip-flop circuits, (f) a wired AND for logically multiplying outputs transmitted from the first and second integrated injection logic gates, (g) a third integrated injection logic gate for inverting a logical product transmitted from the wired AND, (h) a fourth integrated injection logic gate for inverting an output transmitted from the third integrated injection logic gate, and (i) a switching buffer for switching a mode of the television tuner between the UHF and VHF modes in accordance with an output transmitted from the fourth integrated injection logic gate.

Operation switching signals by each of which the VHF-L band, the VHF-H band, or the UHF band is selected are input in serial to the signal receiver. Then, the operation switching signals are converted by the data converter into parallel signals, and retained in the flip-flop circuits constituting the data retainer, for instance. The setting data of a normal output of the first flip-flop circuit in the data latch circuit is inverted by the first integrated injection logic gate, and the setting data of a normal output of the second flip-flop circuit in the data latch circuit is inverted by the second integrated injection logic gate. Those two inverted setting data are logically multiplied by the wired AND. The thus logically multiplied setting data is twice inverted by the third and fourth second integrated injection logic gates, and then, input into the switching buffer. The switching buffer outputs control signals through a control output wiring in accordance with the setting data transmitted thereto. The control signals are input into a television tuner. Hence, even if the setting data about UHF and FM bands are altered in position in an operation switching signal, a mode in a television tuner is switched between UHF and VHF modes in accordance with the setting data about VHF-L and -H bands, regardless of alteration in position of the setting data about UHF and FM bands.

There is yet further provided a tuner integrated circuit to be used for a television tuner including VHF mode for receiving a signal having a frequency of VHF-L and VHF-H bands, and UHF mode for receiving a signal having a frequency of UHF band, the tuner integrated circuit including (a) a signal receiver for serially receiving operation switching signals by each of which the VHF-L band, the VHF-H band, or the UHF band is selected, (b) a data converter for converting the operation switching signals serially received in the signal receiver into parallel signals, (c) a CMOS AND gate for logically multiplying inverted outputs transmitted from the data converter, and (d) a switching buffer for switching a mode of the television tuner between the UHF and VHF modes in accordance with an output transmitted from the CMOS AND gate.

The tuner integrated may further include a data latch circuit for retaining the parallel signals therein. Each of the operation switching signals preferably includes at least four-bit data each of which is indicative of whether the VHF-L band, the VHF-H band, or the UHF band is selected, in which case the data latch circuit preferably includes at least four flip-flop circuits. It is preferable that inverted outputs transmitted from first and second flip-flop circuits among the flip-flop circuits are logically multiplied by the CMOS AND gate.

Operation switching signals by each of which the VHF-L band, the VHF-H band, or the UHF band is selected are input in serial to the signal receiver. Then, the operation switching signals are converted by the data converter into parallel signals, and retained in the flip-flop circuits constituting the data retainer, for instance. Inverted outputs transmitted from first and second flip-flop circuits among the flip-flop circuits are logically multiplied by the CMOS AND gate, and the thus logically multiplied setting data is input into the switching buffer. The switching buffer outputs control signals through a control output wiring in accordance with the setting data transmitted thereto. The control signals are input into a television tuner. Hence, even if the setting data about UHF and FM bands are altered in position in an operation switching signal, a mode in a television tuner is switched between UHF and VHF modes in accordance with the setting data about VHF-L and -H bands, regardless of alteration in position of the setting data about UHF and FM bands.

There is still yet further provided a tuner integrated circuit to be used for a television tuner including VHF mode for receiving a signal having a frequency of VHF-L and VHF-H bands, and UHF mode for receiving a signal having a frequency of UHF band, the tuner integrated circuit including (a) a signal receiver for serially receiving operation switching signals each including at least four-bit data each of which is indicative of whether the VHF-L band, the VHF-H band, or the UHF band is selected, (b) a data converter for converting the operation switching signals serially received in the signal receiver into parallel signals, (c) a data latch circuit including at least four flip-flop circuits for retaining the parallel signals therein, (d) a first inverter for inverting a normal output transmitted from a first flip-flop circuit among the flip-flop circuits, (e) a second inverter for inverting a normal output transmitted from a second flip-flop circuit among the flip-flop circuits, (f) a CMOS AND gate for logically multiplying outputs transmitted from the first and second inverters, and (g) a switching buffer for switching a mode of the television tuner between the UHF and VHF modes in accordance with an output transmitted from the CMOS AND gate.

Operation switching signals by each of which the VHF-L band, the VHF-H band, or the UHF band is selected are input in serial to the signal receiver. Then, the operation switching signals are converted by the data converter into parallel signals, and retained in the flip-flop circuits constituting the data retainer, for instance. The setting data of a normal output of the first flip-flop circuit in the data latch circuit is inverted by the first inverter, and the setting data of a normal output of the second flip-flop circuit in the data latch circuit is inverted by the second inverter. Those two inverted setting data are logically multiplied by the CMOS AND gate. The thus logically multiplied setting data is input into the switching buffer. The switching buffer outputs control signals through a control output wiring in accordance with the setting data transmitted thereto. The control signals are input into a television tuner. Hence, even if the setting data about UHF and FM bands are altered in position in an operation switching signal, a mode in a television tuner is switched between UHF and VHF modes in accordance with the setting data about VHF-L and -H bands, regardless of alteration in position of the setting data about UHF and FM bands.

There is further provided a tuner integrated circuit to be used for a television tuner including VHF mode for receiving a signal having a frequency of VHF-L and VHF-H bands, and UHF mode for receiving a signal having a frequency of UHF band, the tuner integrated circuit including (a) a signal receiver for serially receiving operation switching signals by each of which the VHF-L band, the VHF-H band, or the UHF band is selected, (b) a data converter for converting the operation switching signals serially received in the signal receiver into parallel signals, (c) a CMOS NOR gate for making neither-nor operation of normal outputs transmitted from the data converter, and (d) a switching buffer for switching a mode of the television tuner between the UHF and VHF modes in accordance with an output transmitted from the CMOS NOR gate.

The tuner integrated circuit may further include a data latch circuit for retaining the parallel signals therein. It is preferable that each of the operation switching signals includes at least four-bit data each of which is indicative of whether the VHF-L band, the VHF-H band, or the UHF band is selected, in which case, the data latch circuit includes at least four flip-flop circuits.

The neither-nor operation by the CMOS NOR gate may be made for normal outputs transmitted from first and second flip-flop circuits among the flip-flop circuits.

Operation switching signals by each of which the VHF-L band, the VHF-H band, or the UHF band is selected are input in serial to the signal receiver. Then, the operation switching signals are converted by the data converter into parallel signals, and retained in the flip-flop circuits constituting the data retainer, for instance. Inverted outputs transmitted from first and second flip-flop circuits among the flip-flop circuits are negatively logically summed by the CMOS NOR gate, and the thus negatively logically summed setting data is input into the switching buffer. The switching buffer outputs control signals through a control output wiring in accordance with the setting data transmitted thereto. The control signals are input into a television tuner. Hence, even if the setting data about UHF and FM bands are altered in position in an operation switching signal, a mode in a television tuner is switched between UHF and VHF modes in accordance with the setting data about VHF-L and -H bands, regardless of alteration in position of the setting data about UHF and FM bands.

There is further provided a television tuner including (a) one of the above-mentioned tuner integrated circuits, (b) a first signal receiver for receiving signals having frequencies of VHF-L and VHF-H bands, (c) a second signal receiver for receiving signals having a frequency of UHF band, and (d) a driver for selectively driving one of the first and second signal receivers in accordance with an output transmitted from the tuner integrated circuit.

In the above-mentioned television tuner, signals having frequencies of VHF-L and VHF-H bands are received by the first signal receiver, and signals having a frequency of UHF band are received by the second signal receiver. The tuner integrated circuit outputs a control signal in accordance with setting data about VHF-L and -H bands in the operation switching signal, in accordance with which one of the first and second signal receivers is selectively operated by the driver.

In still another aspect of the present invention, there is provided a method of controlling a television tuner including a first signal receiver receiving signals having frequencies of VHF-L and VHF-H bands, and a second signal receiver receiving a signal having a frequency of UHF band, including the steps of (a) receiving an operation switching signal by which the VHF-L band, the VHF-H band, or the UHF band is selected, and (b) driving the second signal receiver and pausing the first signal receiver when none of the VHF-L and VHF-H bands is selected by the operation switching signal.

In accordance with the above-mentioned method, even if the setting data about UHF band is altered in position in an operation switching signal, the second signal receiver is selectively operated or not operated, only based on the setting data about VHF-L and -H bands, regardless of alteration in position of the setting data about UHF band.

There is further provided a method of controlling a television tuner including a first signal receiver receiving signals having frequencies of VHF-L and VHF-H bands, and a second signal receiver receiving a signal having a frequency of UHF band, including the steps of (a) receiving an operation switching signal by which the VHF-L band, the VHF-H band, or the UHF band is selected, (b) driving the second signal receiver and pausing the first signal receiver when none of the VHF-L and VHF-H bands is selected by the operation switching signal, and (c) driving the first signal receiver and pausing the second signal receiver when one of the VHF-L and VHF-H bands is selected by the operation switching signal.

In accordance with the above-mentioned method, the second signal receiver is selectively operated or not operated, only based on the setting data about VHF-L and -H bands, regardless of alteration in position of the setting data about UHF band, even if the setting data about UHF band is altered in position in an operation switching signal.

There is still further provided a method of controlling a television tuner including VHF mode for receiving a signal having a frequency of VHF-L and VHF-H bands, and UHF mode for receiving a signal having a frequency of UHF band, the method including the steps of (a) receiving an operation switching signal by which the VHF-L band, the VHF-H band, or the UHF band is selected, (b) making a logical product of binary data about the VHF-L and VHF-H bands, represented by the operation switching signal, and (c) switching a mode of the television tuner between the UHF and VHF modes in accordance with the logical product.

In accordance with the above-mentioned method, a mode of a television tuner is switched between UHF and VHF modes in accordance with a logical product of setting data about VHF-L and -H bands in the operation switching signal. Hence, even if the setting data about UHF and FM bands are exchanged in position in an operation switching signal, it is possible to switch a mode of a television tuner between UHF and VHF modes, regardless of alteration in position of the setting data about UHF and FM bands.

In yet another aspect of the present invention, there is provided a recording medium readable by a computer, storing a program therein for causing a computer to act as one of the above-mentioned television tuners.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 1 is a block diagram of a conventional television tuner.

DESCRIPTION OF THE PREFERRED EMBODIMENTS

Figures 2A, 2B:
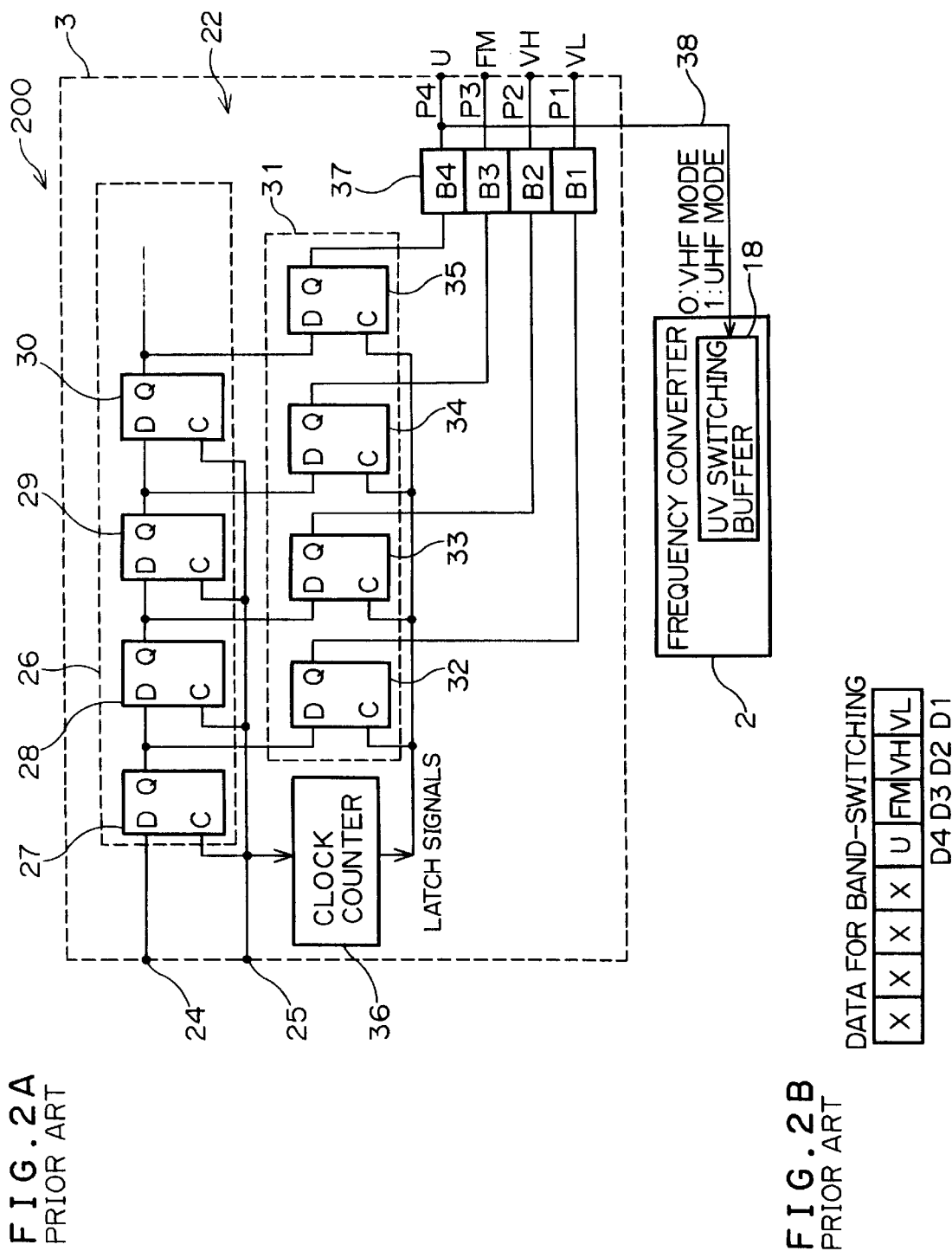
FIG. 2A is a block diagram of a tuner integrated circuit constituting a part of the television tuner illustrated in FIG. 1.
FIG. 2B illustrates data for switching a band, used in the tuner integrated circuit illustrated in FIG. 2A.
Figure 3:
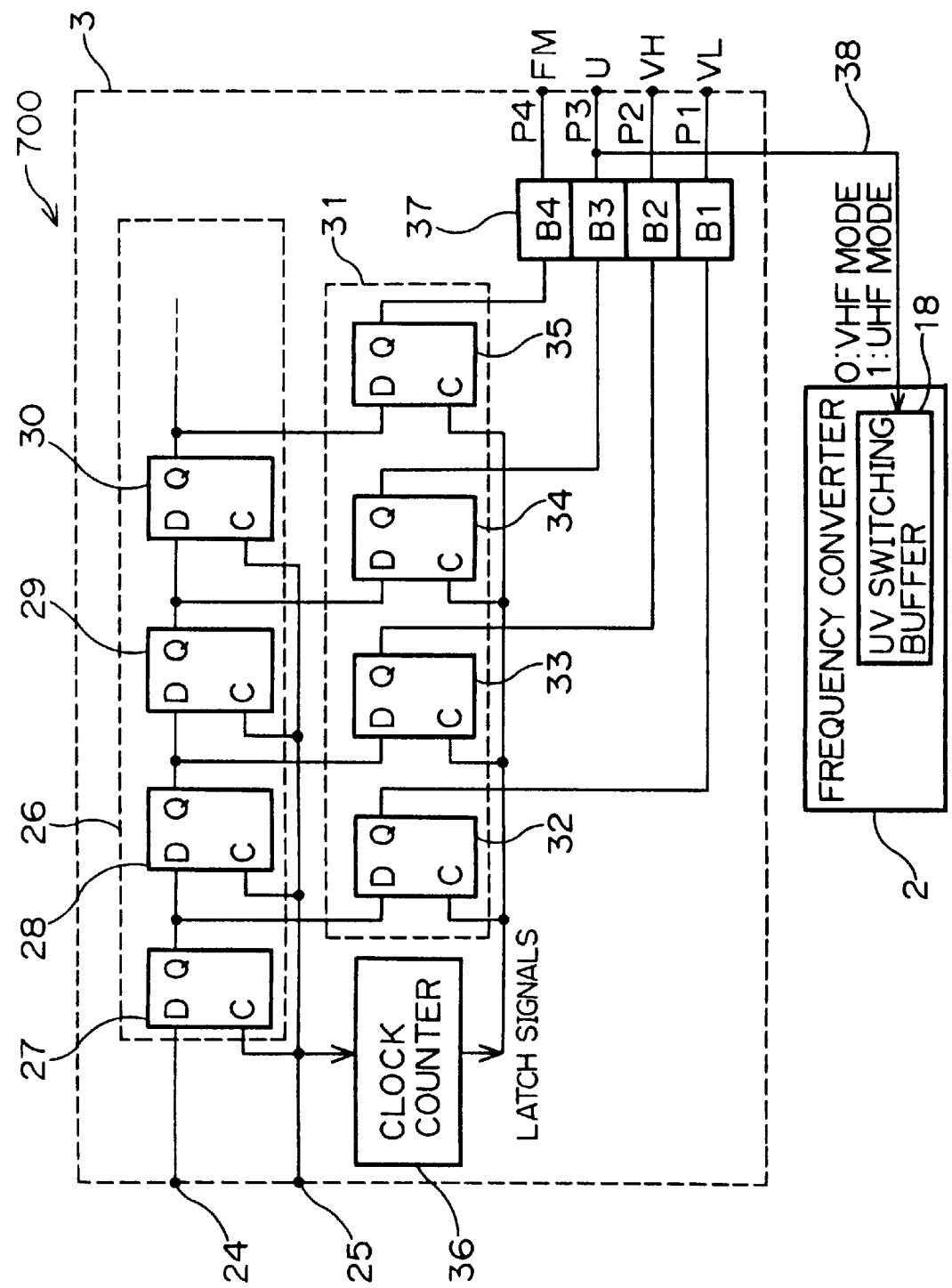
FIG. 3 is a block diagram of a tuner integrated circuit constituting a part of another television tuner.
Figures 4A, 4B:
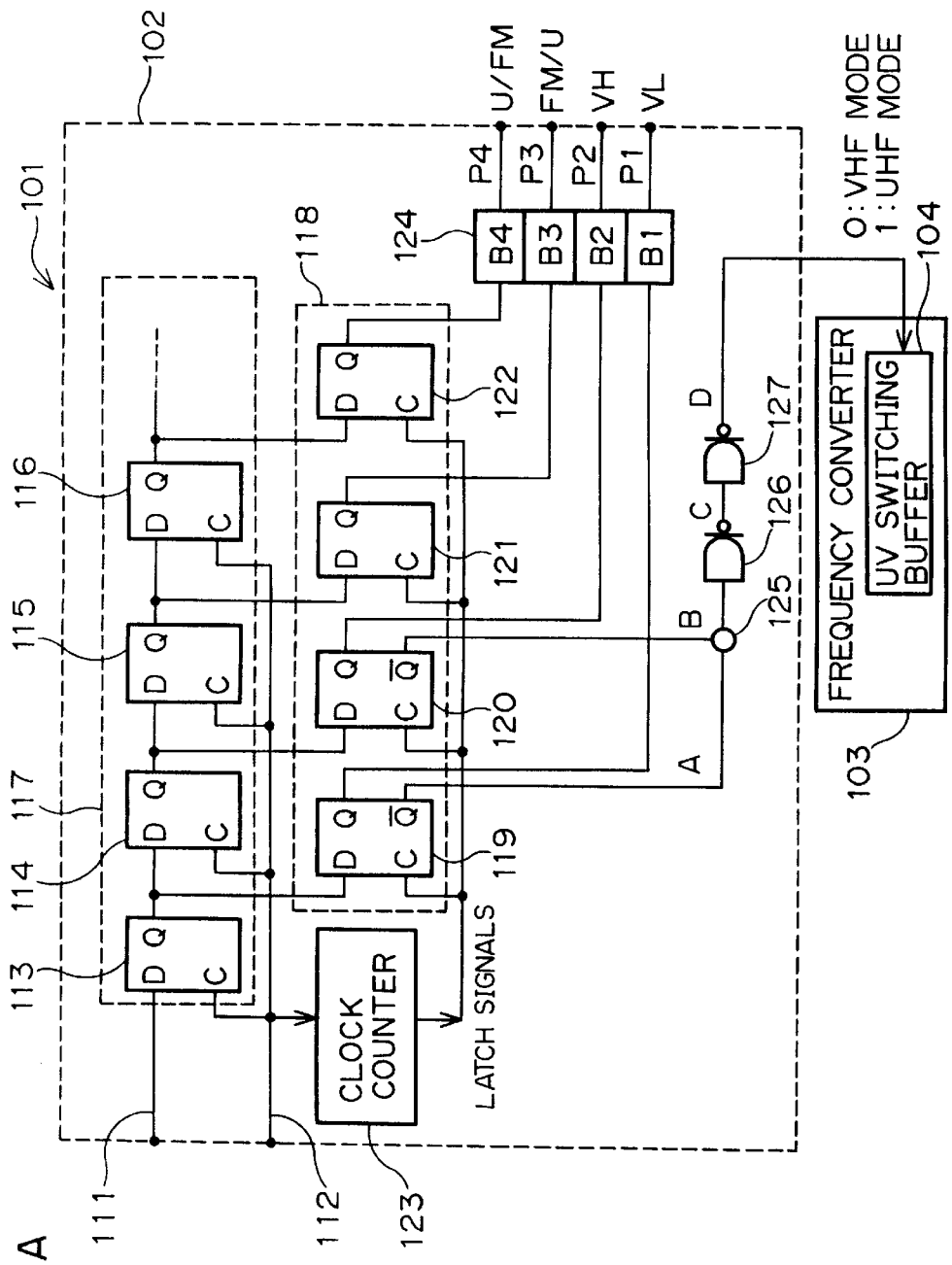
FIG. 4A is a block diagram of a tuner integrated circuit constituting a part of a television tuner in accordance with the first embodiment of the present invention.
FIG. 4B illustrates data for switching a band, used in the tuner integrated circuit illustrated in FIG. 4A.

A television tuner in accordance with the first embodiment is explained hereinbelow with reference to FIGS. 4A and 4B. Parts or elements that correspond to those of the conventional television tuner illustrated in FIG. 1 have been provided with the same names, and are not detailed. FIG. 4A is a block diagram of a tuner integrated circuit constituting a part of the television tuner in accordance with the first embodiment of the present invention.

An illustrated tuner integrated circuit 101 includes a tuner controller 102 to which a frequency converter 103 is connected. The frequency converter 103 includes mixers (not illustrated) for mixing frequencies of UHF, VHF-L, and VHF-H bands, local oscillators (not illustrated), and a UV switching buffer 104 for switching the mixers and the local oscillators.

The tuner integrated circuit 101 includes a data input wiring 111 through which input signals are transmitted into the tuner integrated circuit 101, and a clock input wiring 112 through which clock signals are input into the tuner integrated circuit 101. These input wirings 111 and 112 are connected to a control circuit (not illustrated) acting as a signal transmitter from which operation switching signals are transmitted.

The data input wiring 111 and the clock input wiring 112 are connected to a serial-parallel converter 117 as a data converter, comprised of eight D-type flip-flop circuits 113 to 122 connected to each other in serial. The first four flip-flop circuits 113 to 116 of the serial-parallel converter 117 are connected in parallel to the remaining four D-type flip-flop circuits 119 to 122 constituting a data latch circuit 118 as a data retainer.

Each of the four flip-flop circuits 119 to 122 constituting the data latch circuit 118 has a control terminal connected to a 8-clock counter 123 connected to the clock input wiring 112. The last four flip-flop circuits 119 to 122 constituting the data latch circuit 122 have normal output terminals connected to the output terminals P1, P2, P3, and P4, respectively, through a four-bit band switching buffer 124.

That is, the first flip-flop circuit 119 of the data latch circuit 118 is connected to a first bit buffer B1 retaining setting data D1 about VHF-L band in an operation switching signal. The second flip-flop circuit 120 is connected to a second bit buffer B2 retaining setting data D2 about VHF-H band. The third flip-flop circuit 121 is connected to a third bit buffer B3 retaining setting data D3 about one of UHF and FM bands. The fourth flip-flop circuit 122 is connected to a fourth bit buffer B4 retaining setting data D4 about the other of UHF and FM bands.

The first and second flip-flop circuits 119 and 120 of the data latch circuit 118 have inverted output terminals connected to a wired AND 125 acting as a logical multiplier. First and second integrated injection logic (IIL) gates 126 and 127 are connected in series to the wired AND 125. The second integrated injection logic gate 127 is connected further to the UV switching buffer 104 constituting a part of the frequency converter 103.

Figure 1:
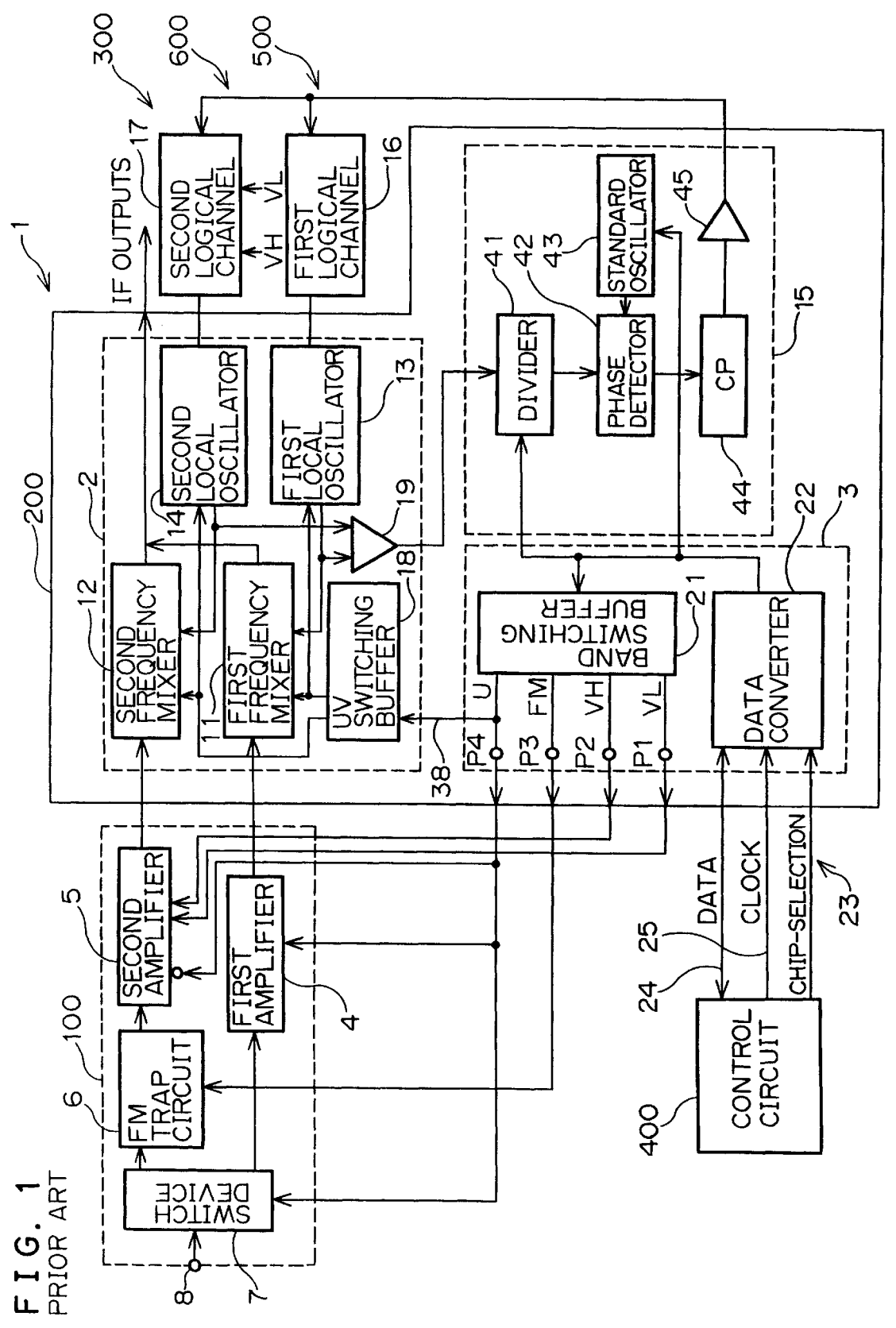

The television tuner in accordance with the first embodiment, which included the above-mentioned tuner integrated circuit 101, has a first circuit for receiving signals having frequencies in UHF band, and a second circuit for receiving signals having frequencies in VHF-L and -H bands, similarly to the conventional television tuner illustrated in FIG. 1. The first circuit is comprised of an amplifier for amplifying signals having frequencies in UHF band, a mixer for mixing signals having frequencies in UHF band, a local oscillator for UHF band, a logical channel for UHF band, and the like, and receives radio waves and wired signals having frequencies in UHF band. The second circuit is comprised of an amplifier for amplifying signals having frequencies in VHF-L And -H bands, a mixer for mixing signals having frequencies in VHF-L and -H bands, a local oscillator for VHF-L and -H bands, a logical channel for VHF-L and -H bands, and the like, and receives radio waves and wired signals having frequencies in VHF-L, VHF-H, and FM bands.

Though detailed later, the setting data D1 and D2 about VHF-L and -H bands, respectively, in operation switching signals transmitted from the control circuit (not illustrated) to the tuner integrated circuit 101 are logically multiplied by the wired AND 125. In accordance with the thus calculated logical product, the UV switching buffer 104 switches the mixer between a first mixer used for UHF band and a second mixer used for VHF-L and -H bands, and the local oscillator between a first local oscillator used for UHF band and a second local oscillator used for VHF-L and -H bands. As a result, a mode is switched between UHF mode and VHF mode in the frequency converter 103. Hence, the UV switching buffer 104 acts as the switching device, the detector, the signal transmitter, and the driver.

In the first embodiment, the driver is comprised of a single UV switching buffer 104. However, it should be noted that the driver may be comprised of two UV switching buffers one of which drives an amplifier for amplifying signals having frequencies in UHF band, and the like, and the other drives an amplifier for amplifying signals having frequencies in VHF-L and -H bands, and the like.

The television tuner 101 having the above-mentioned structure can receive signals having frequencies in UHF, VHF-L, and VHF-H bands, transmitted in the form of radio waves or wired signals, in the above-mentioned first and second circuits. A control for switching an operation mode between UHF mode and VHF mode is accomplished by the tuner controller 102.

In the above-mentioned control for switching an operation mode, 8-bit operation switching signals each indicating that VHF-L, VHF-H, FM, or UHF band is selected or not in a single bit are input in serial to the data input wiring 111 of the tuner controller 102 from the control circuit (not illustrated in FIG. 4A), and the thus input operation switching signals are converted into parallel signals by the serial-parallel converter 117.

The thus converted operation switching signals are retained in the four flip-flop circuits 119 to 122 of the data latch circuit 118, and then, input to the band switching buffer 124 in parallel. As a result, the band switching buffer 124 transmits control signals associated with the operation switching signals, to the high frequency amplifying section and the frequency converter 103.

That is, the control signals associated with the setting data D3 about UHF band are transmitted to the first and second amplifiers for amplifying signals for UHF and VHF bands, through the output terminal P3 from the third bit buffer B3 of the band switching buffer 124. The first and second amplifiers are switched therebetween in accordance with the control signals.

Similarly, the control signals associated with the setting data D1 and D2 about VHF-L and -H bands are transmitted to the amplifier for amplifying signals for VHF band, through the output terminals P1 and P2 from the first and bit buffers B1 and B2 of the band switching buffer 124. A tuning frequency band in a logical channel tuning circuit of the above-mentioned amplifier is switched between VHF-L and VHF-H bands in accordance with the setting data D1 and D2 about VHF-L and VHF-H bands, respectively.

In addition, the control signals associated with the setting data D4 about FM band are transmitted to the FM trap circuit of the high frequency amplifying section through the output terminal P4 from the fourth bit buffer B4 of the band switching buffer 124. Hence, the FM trap circuit does not trap FM band, if the setting data D4 about FM band indicates that FM band is selected, but traps FM band, if the setting data D4 about FM band indicates that FM band is selected.

The setting data D1 and D2 about VHF-H and VHF-L bands in the operation switching signals are retained in the first and second flip-flop circuits 119 and 120 of the data latch circuit 118. As illustrated in FIG. 4 and Table 1 shown below, setting data A and B of inverted outputs transmitted from the first and second flip-flop circuits 119 and 120 are logically multiplied in the wired AND 125. The thus logically multiplied setting data is inverted into setting data C by the first integrated injection logic gate 126. The setting data C is inverted again into setting data D by the second integrated injection logic gate 127, and input into the UV switching buffer 104.

TABLE 1

| VL B1 | VH B2 | U/FM B3 | FM/U B4 | A | B | C | D | UV SW |
|---|---|---|---|---|---|---|---|---|
| 1 | 0 | X | X | 0 | 1 | 1 | 0 | VHF |
| 0 | 1 | X | X | 1 | 0 | 1 | 0 | VHF |
| 0 | 0 | X | X | 1 | 1 | 0 | 1 | UHF |
| 1 | 1 | X | X | 0 | 0 | 1 | 0 | VHF |

As mentioned earlier, the setting data D input into the UV switching buffer 104 becomes "1" only when the initial operation switching signals for VHF-H and VHF-L bands are both "0". This means that the setting data D corresponds to switching between UHF and VHF modes of the frequency converter 103.

In the first embodiment, the tuner integrated circuit 101 switches a mode in the frequency converter 103 in accordance with the setting data of VHF-L and VHF-H bands in the operation switching signals. Hence, even if the setting data about UHF and FM bands are exchanged in position in the operation switching signals, a mode in the frequency converter 103 is switched between UHF and VHF modes in accordance with the setting data about VHF-L and -H bands, regardless of alteration in position of the setting data about UHF and FM bands.

That is, the tuner integrated circuit 101 in the first embodiment can conform to the operation switching signals having two kinds of formats, which ensures a higher fabrication yield. In particular, a logical multiplier for producing control signals for the frequency converter 103, based on the operation switching signals, is comprised of the wired AND 125, and buffers for the wired AND 125 are comprised of two integrated injection logic gates 126 and 127. As a result, it is possible to omit circuits which would be added to a conventional structure, resulting in higher productivity, smaller size, and lighter weight.

In addition, since portions outside the tuner integrated circuit 101 in the television tuner are not necessary to be altered or remodeled, it is possible to keep a fabrication yield of the television tuner high.

Furthermore, the tuner integrated circuit 101 in the first embodiment can be used for two kinds of television tuners having different formats in the operation switching signal. In such a case, it is not necessary to switch a dip switch in the tuner integrated circuit 101, and hence, it would be avoidable, when television tuners are fabricated, that defective television tuners are fabricated by incorporating a tuner integrated circuit having a different format in the operation switching signal.

Figure 5:
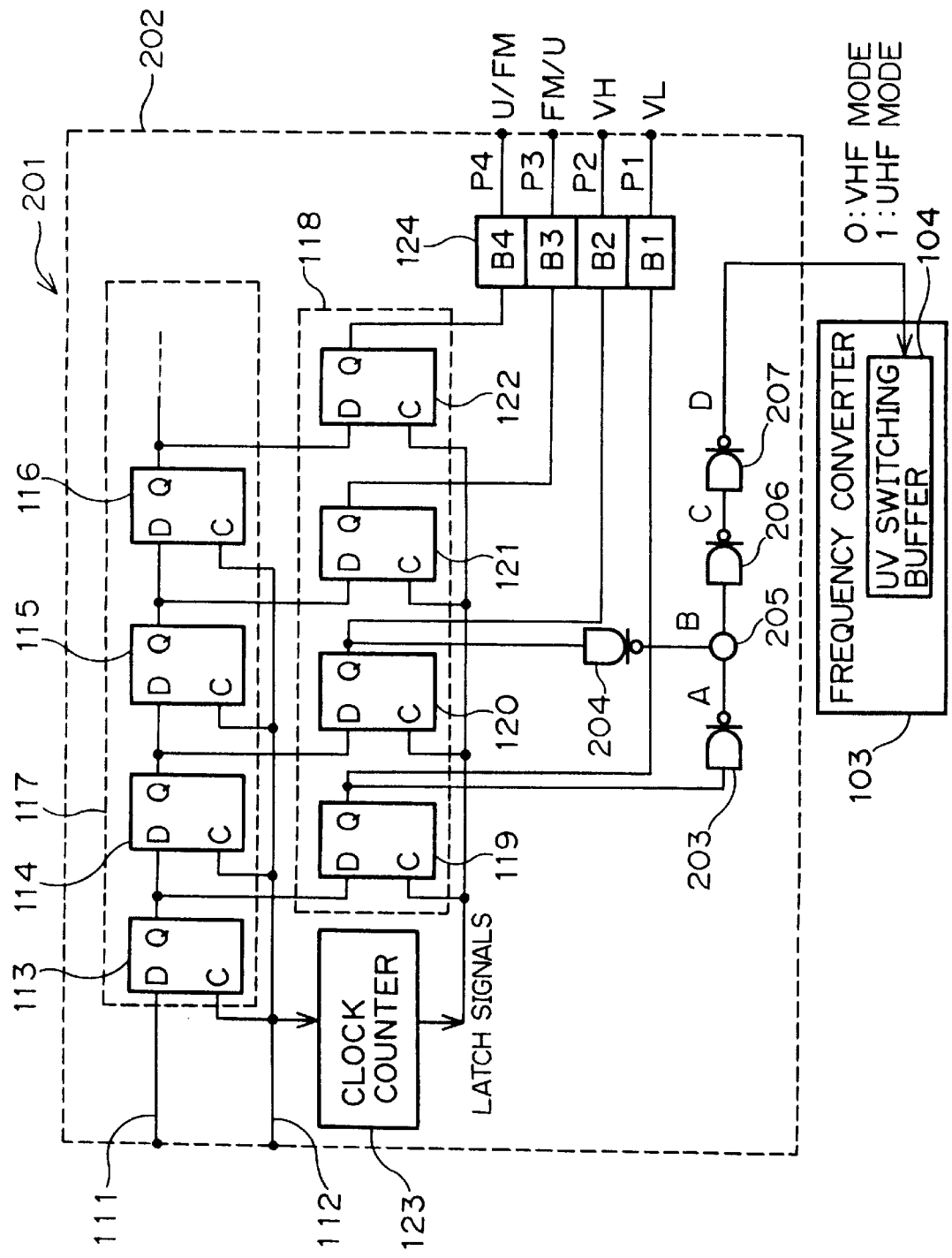
FIG. 5 is a block diagram of a tuner integrated circuit constituting a part of a television tuner in accordance with the second embodiment of the present invention.

A television tuner in accordance with the second embodiment is explained hereinbelow with reference to FIG. 5. Parts or elements that correspond to those of the first embodiment illustrated in FIG. 4A have been provided with the same reference numerals and names, and are not detailed. FIG. 5 is a block diagram of a tuner integrated circuit constituting a part of the television tuner in accordance with the second embodiment of the present invention.

In a tuner integrated circuit 201 of the television tuner in accordance with the second embodiment, a tuner controller 202 is connected to a frequency converter 103, similarly to the tuner integrated circuit 101 illustrated in FIG. 4A.

The tuner controller 202 has almost the same structure as that of the tuner controller 102 of the tuner integrated circuit 101, but is different from the tuner controller 102 in a connection between the data latch circuit 108 and the UV switching circuit 104.

In the second embodiment, the first flip-flop circuit 119 of the data latch circuit 118 has a normal output terminal connected to a first integrated injection logic gate 203, and the second flip-flop circuit 120 of the data latch circuit 118 has a normal output terminal connected to a second integrated injection logic gate 204. The first and second integrated injection logic gates 203 and 204 are both connected to a wired AND 205 acting as a logical multiplier. The wired AND 205 is connected in series to third and fourth integrated injection logic gates 206 and 207, and the fourth integrated injection logic gate 207 is connected to the UV switching buffer 104 of the frequency converter 103.

The tuner integrated circuit 201 in the second embodiment switches an operation mode of the frequency converter 103 in accordance with the operation switching signals, similarly to the tuner integrated circuit 101 illustrated in FIG. 4A.

In the above-mentioned switching control, since the operation switching signals having been input in serial into the data input wiring 111 are converted into parallel signals by the serial-parallel converter 117, and then, retained in the four flip-flop circuits 119 to 122 of the data latch circuit 118, the setting data of VHF-H and -L bands in the operation switching signal are retained in the first and second flip-flop circuits 119 and 120 of the data latch circuit 118.

As illustrated in FIG. 5 and Table 2 shown below, the setting data transmitted from normal output terminals of the first and second flip-flop circuits 119 and 120 are inverted into setting data A and B by the first and second integrated injection logic gates 203 and 204, respectively. The thus obtained setting data A and B are logically multiplied in the wired AND 205.

Then, the thus logically multiplied setting data is inverted into setting data C by a third integrated injection logic gate 206. The thus obtained setting data C is inverted again into setting data D by a fourth integrated injection logic gate 207, and the thus produced setting data D is input into the UV switching buffer 104 of the frequency converter 103.

TABLE 2

| VL B1 | VH B2 | U/FM B3 | FM/U B4 | A | B | C | D | UV SW |
|---|---|---|---|---|---|---|---|---|
| 1 | 0 | X | X | 0 | 1 | 1 | 0 | VHF |
| 0 | 1 | X | X | 1 | 0 | 1 | 0 | VHF |
| 0 | 0 | X | X | 1 | 1 | 0 | 1 | UHF |
| 1 | 1 | X | X | 0 | 0 | 1 | 0 | VHF |

Similarly to the tuner integrated circuit 101, since the tuner integrated circuit 201 in the second embodiment switches a mode of the frequency converter 103 in accordance with the setting data of VHF-L and -H bands in the operation switching signal, it is possible to process the operation switching signals having two kinds of formats, with a single tuner integrated circuit, which ensures a high fabrication yield.

Differently from the tuner controller 102 in the first embodiment, in the tuner integrated circuit 201 in the second embodiment, normal outputs transmitted from the first and second flip-flop circuits 119 and 120 of the data latch circuit 118 are inverted by the integrated injection logic gates 203 and 204, respectively, and then, logically multiplied in the wired AND 205.

Hence, the tuner integrated circuit 201 in the second embodiment has a greater number of elements than that of the tuner integrated circuit 101 in the first embodiment.

However, it is no longer necessary to make wirings to be connected to inverted outputs of the first and second flip-flop circuits 119 and 120. Hence, for instance, a wiring connecting the normal outputs of the first and second flip-flop circuits 119 and 120 to the band switching buffer 124 may be branched, and the thus branched wirings may be connected to the integrated injection logic gates 203 and 204. This arrangement makes an area occupied by wirings smaller, and a circuit smaller in size.

Figure 6:
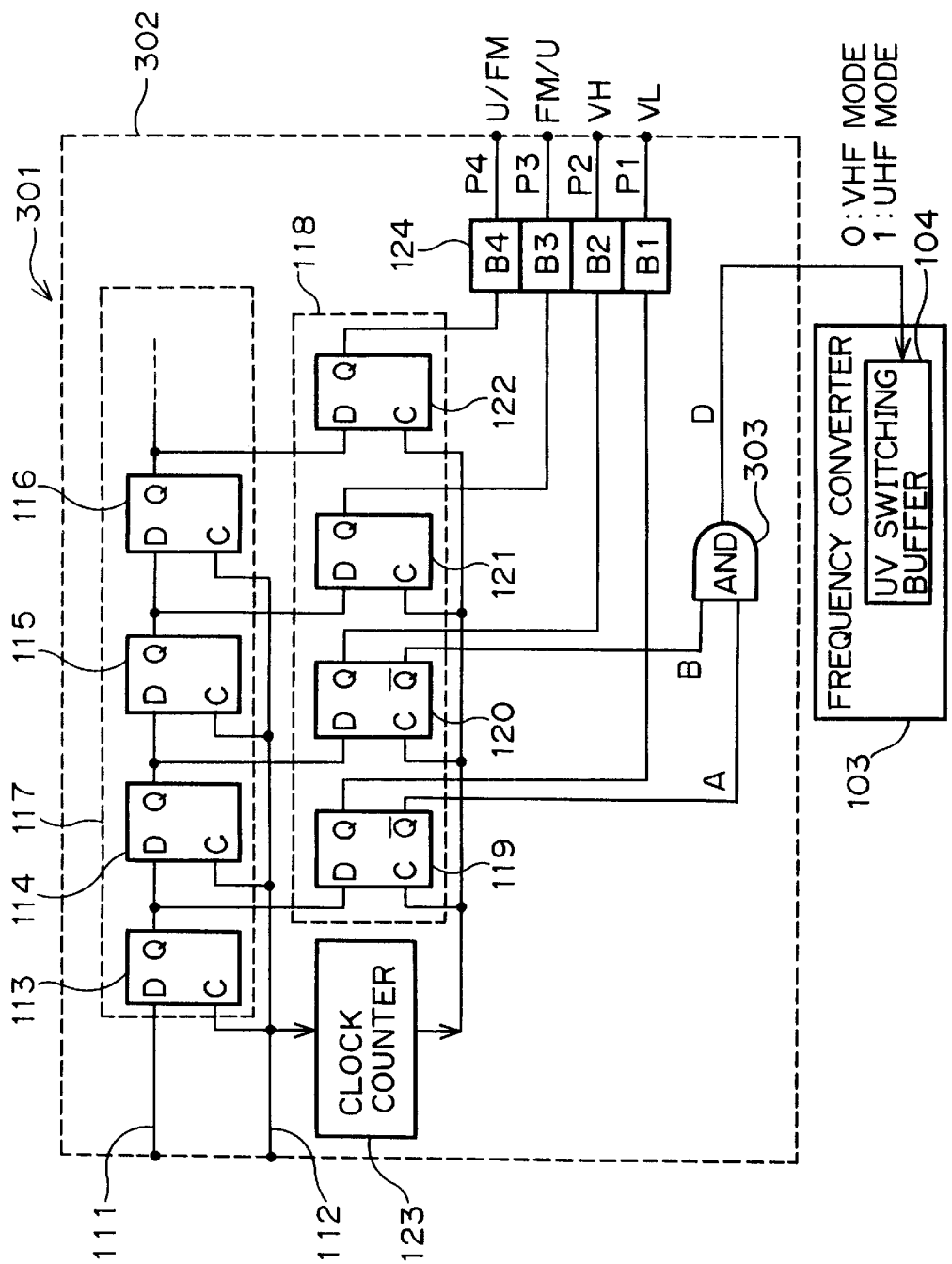
FIG. 6 is a block diagram of a tuner integrated circuit constituting a part of a television tuner in accordance with the third embodiment of the present invention.

A television tuner in accordance with the third embodiment is explained hereinbelow with reference to FIG. 6. Parts or elements that correspond to those of the first embodiment illustrated in FIG. 4A have been provided with the same reference numerals and names, and are not detailed. FIG. 6 is a block diagram of a tuner integrated circuit constituting a part of the television tuner in accordance with the third embodiment of the present invention.

In a tuner integrated circuit 301 of the television tuner in accordance with the third embodiment, a tuner controller 302 is connected to a frequency converter 103, similarly to the tuner integrated circuit 101 illustrated in FIG. 4A.

The tuner controller 302 has almost the same structure as that of the tuner controller 102 of the tuner integrated circuit 101, but is different from the tuner controller 102 in a connection between the data latch circuit 108 and the UV switching circuit 104.

In the tuner controller 302 of the tuner integrated circuit 301 in accordance with the third embodiment, inverted outputs of the first and second flip-flop circuits 119 and 120 of the data latch circuit 118 are connected to a CMOS AND gate 303 acting as a logical multiplier, and the CMOS AND gate 303 is connected to the Lw switching buffer 104 of the frequency converter 103.

The tuner integrated circuit 301 in the third embodiment switches an operation mode of the frequency converter 103 in accordance with the operation switching signals, similarly to the tuner integrated circuit 101 illustrated in FIG. 4A.

As illustrated in FIG. 6 and Table 3 shown below, the setting data A and B transmitted from the inverted output terminals of the first and second flip-flop circuits 119 and 120 are logically multiplied into setting data D by the CMOS AND gate 303, and the thus obtained logical product as the setting data D is input into the UV switching buffer 104 of the frequency converter 103.

TABLE 3

| VL B1 | VH B2 | U/FM B3 | FM/U B4 | A | B | D | UV SW |
|---|---|---|---|---|---|---|---|
| 1 | 0 | X | X | 0 | 1 | 0 | VHF |
| 0 | 1 | X | X | 1 | 0 | 0 | VHF |
| 0 | 0 | X | X | 1 | 1 | 1 | UHF |
| 1 | 1 | X | X | 0 | 0 | 0 | VHF |

The UV switching buffer 104 receives the setting data D defined as mentioned above, and transmits control signals through a control signal wiring in accordance with the received setting data D. An operation mode in the frequency converter 103 is switched between UHF and VHF modes in accordance with the control signals.

Similarly to the tuner integrated circuit 101, since the tuner integrated circuit 301 in the third embodiment switches a mode of the frequency converter 103 in accordance with the setting data of VHF-L and -H bands in the operation switching signal, it is possible to process the operation switching signals having two kinds of formats, with a single tuner integrated circuit, which ensures a high fabrication yield.

Differently from the tuner controller 102 in the first embodiment, the inverted outputs of the first and second flip-flop circuits 119 and 120 are logically multiplied by the CMOS AND gate 303 in the tuner integrated circuit 301. Hence, it is unavoidable that the tuner integrated circuit 301 in the third embodiment has more complicated circuit structure than that of the tuner integrated circuit 101 in the first embodiment. However, the tuner integrated circuit 301 in the third embodiment has a smaller number of circuit elements than that of the tuner integrated circuit 101 in the first embodiment, from the viewpoint of which the tuner integrated circuit 301 could have higher productivity, smaller size, and lighter weight.

Figure 7:
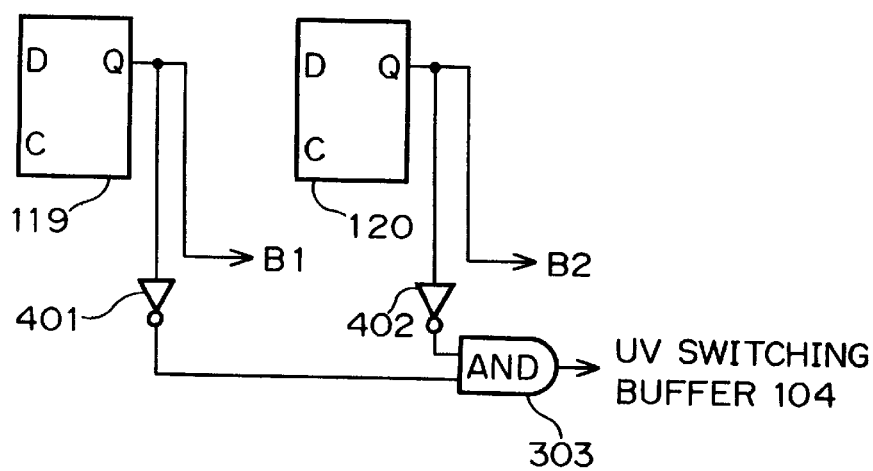
FIG. 7 is a partial block diagram of a tuner integrated circuit constituting a part of a television tuner in accordance with the fourth embodiment of the present invention.

FIG. 7 partially illustrates a tuner integrated circuit constituting a part of a television tuner in accordance with the fourth embodiment. The illustrated tuner integrated circuit has almost the same structure as that of the tuner integrated circuit 301 illustrated in FIG. 6, but is different from the tuner integrated circuit 301 in further having a first inverter 401 connected to the first flip-flop circuit 119, and a second inverter 402 connected to the second flip-flop circuit 120. Normal outputs of the first and second flip-flop circuits 119 and 120 are inverted by the first and second inverters 401 and 402, respectively. The thus inverted normal outputs are logically multiplied by the CMOS AND gate 303.

The fourth embodiment provides the same advantages of the above-mentioned third embodiment.

Figure 8:
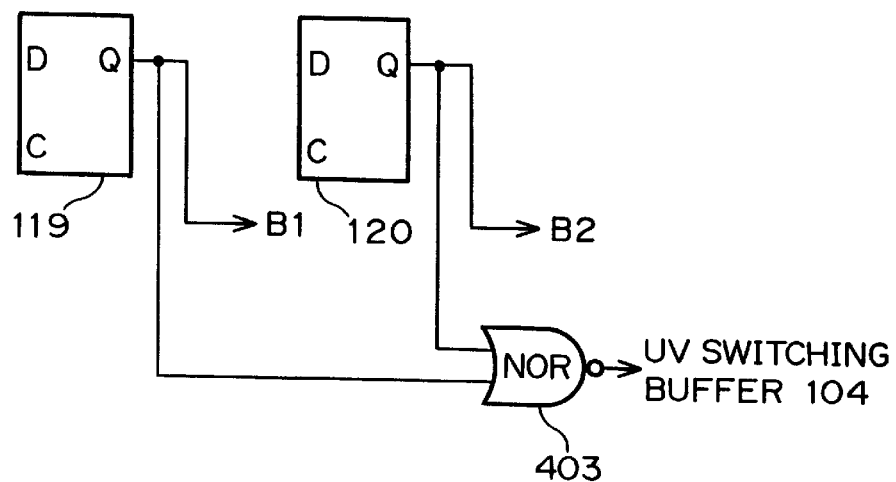
FIG. 8 is a partial block diagram of a tuner integrated circuit constituting a part of a television tuner in accordance with the fifth embodiment of the present invention.

FIG. 8 partially illustrates a tuner integrated circuit constituting a part of a television tuner in accordance with the fifth embodiment. The illustrated tuner integrated circuit has almost the same structure as that of the tuner integrated circuit 301 illustrated in FIG. 6, but is different from the tuner integrated circuit 301 in that the illustrated tuner integrated circuit includes a CMOS NOR gate 403 in place of the CMOS AND gate 303.

Normal outputs of the first and second flip-flop circuits 119 and 120 are negatively, logically summed by the CMOS NOR gate 403. The fifth embodiment provides the same advantages of the above-mentioned third embodiment.

Hereinbelow is explained an embodiment of a recording medium storing a program therein for accomplishing the above-mentioned television tuners.

A recording medium storing a program for accomplishing the above-mentioned television tuners may be accomplished by programming functions of the above-mentioned television tuners with a programming language readable by a computer, and recording the program in a recording medium such as CD-ROM, a floppy disc, a magnetic tape, and any other suitable means for storing a program therein.

As a recording medium may be employed a hard disc equipped in a server. It is also possible to accomplish the recording medium in accordance with the present invention by storing the above-mentioned computer program in a recording medium as mentioned above, and reading the computer program by other computers through a network.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 9-266467 filed on, Sep. 30, 1997 including specification, claims, drawings and summary is incorporated herein by reference in its entirety.

What is claimed is:

1. A television tuner comprising:
   (a) a series-to-parallel converter receiving switching a serial operation switching signal indicating which has been selected of a VHF-L band, a VHF-H band, an UHF band, or none of these bands;
   (b) a logic circuit receiving the parallel output of said converter, which logic circuit detects that none of said VHF-L and VHF-H bands is selected, based on data about said VHF-L and VHF-H bands.

2. The television tuner as set forth in claim 1, wherein said second signal receiver comprises:
   (b-1) a local oscillator which makes oscillation at a certain frequency; and
   (b-2) a frequency mixer for mixing an oscillation frequency of said local oscillator and a frequency of received signals, and converting the thus mixed frequencies into an intermediate frequency.

3. A television tuner comprising:
   (a) a first amplifier for amplifying received signals having frequencies of VHF-L and VHF-H bands;
   (b) a first converter for converting a frequency of said received signals having been amplified by said first amplifier;
   (c) a second amplifier for amplifying a received signal having a frequency of UHF band;
   (d) a second converter for converting a frequency of said received signal having been amplified by said second amplifier;
   (e) a signal transmitter for transmitting a serial operation switching signal by which said VHF-L band, said VHF-H band, said UHF band, or none of them is selected;
   (f) a series-to-parallel converter receiving said serial operating switching signal;
   (g) a logic circuit receiving the parallel output of said series-to-parallel converter for detecting that none of said VHF-L and VHF-H bands is selected, based on data about said VHF-L and VHF-H bands, represented by said operation switching signal; and
   (h) a driver for driving said second amplifier and pausing said first amplifier when said detector detects that none of said VHF-L and VHF-H bands is selected, and pausing said second amplifier and driving said first amplifier when said detector detects that one of said VHF-L and VHF-H bands is selected.

4. The television tuner as set forth in claim 3, wherein said driver is comprised a first driver and a second driver, said first driver driving said second amplifier and pausing said first amplifier when said detector detects that none of a said VHF-L and VHF-H bands is selected, said second driver pausing said second amplifier and driving said first amplifier when said detector detects that one of said VHF-L and VHF-H bands is selected.

5. A tuner integrated circuit to be used for a television tuner including VHF mode for receiving a signal having a frequency of VHF-L and VHF-H bands, and UHF mode for receiving a signal having a frequency of UHF band, said tuner integrated circuit comprising:
   (a) a signal receiver for serially receiving operation switching signals by each of which said VHF-L band, said VHF-H band, said UHF band, or none of them is selected;
   (b) a data converter for converting said operation switching signals serially received in said signal receiver into parallel signals;
   (c) a logical multiplier for logically multiplying binary data about said VHF-L and VHF-H bands, represented by said operation switching signals; and
   (d) a switching buffer for switching a mode of said television tuner between said UHF and VHF modes in accordance with a logical product provided by said logical multiplier.

6. The tuner integrated circuit as set forth in claim 5, further comprising a data retainer for retaining said parallel signals therein.

7. A tuner integrated circuit to be used for a television tuner including VHF mode for receiving a signal having a frequency of VHF-L and VHF-H bands, and UHF mode for receiving a signal having a frequency of UHF band, said tuner integrated circuit comprising:
   (a) a signal receiver for serially receiving operation switching signals by each of which said VHF-L band, said VHF-H band, said UHF band, or none of them is selected;
   (b) a data converter for converting said operation switching signals serially received in said signal receiver into parallel signals;
   (c) a wired AND for logically multiplying inverted outputs transmitted from said data converter;
   (d) a first integrated injection logic gate for inverting a logical product transmitted from said wired AND;
   (e) a second integrated injection logic gate for inverting data transmitted from said first integrated injection logic gate; and
   (f) a switching buffer for switching a mode of said television tuner between said UHF and VHF modes in accordance with an output transmitted from said second integrated injection logic gate.

8. The tuner integrated circuit as set forth in claim 7, further comprising a data latch circuit for retaining said parallel signals therein.

9. The tuner integrated circuit as set forth in claim 8, wherein each of said operation switching signals includes at least four-bit data each of which is indicative of whether said VHF-L band, said VHF-H band, said UHF band, or none of them is selected, and wherein said data latch circuit includes at least four flip-flop circuits.

10. The tuner integrated circuit as set forth in claim 9, wherein inverted outputs transmitted from first and second flip-flop circuits among said flip-flop circuits are logically multiplied by said wired AND.

11. A tuner integrated circuit to be used for a television tuner including VHF mode for receiving a signal having a frequency of VHF-L and VHF-H bands, and UHF mode for receiving a signal having a frequency of UHF band, said tuner integrated circuit comprising:
   (a) a signal receiver for serially receiving operation switching signals each including at least four-bit data each of which is indicative of whether said VHF-L band, said VHF-H band, said UHF band, or none of them is selected;
   (b) a data converter for converting said operation switching signals serially received in said signal receiver into parallel signals;
   (c) a data latch circuit including at least four flip-flop circuits for retaining said parallel signals therein;
   (d) a first integrated injection logic gate for inverting a normal output transmitted from a first flip-flop circuit among said flip-flop circuits;

(e) a second integrated injection logic gate for inverting a normal output transmitted from a second flip-flop circuit among said flip-flop circuits;

(f) a wired AND for logically multiplying outputs transmitted from said first and second integrated injection logic gates;

(g) a third integrated injection logic gate for inverting a logical product transmitted from said wired AND;

(h) a fourth integrated injection logic gate for inverting an output transmitted from said third integrated injection logic gate; and (i) a switching buffer for switching a mode of said television tuner between said UHF and VHF modes in accordance with an output transmitted from said fourth integrated injection logic gate.

12. A tuner integrated circuit to be used for a television tuner including VHF mode for receiving a signal having a frequency of VHF-L and VHF-H bands, and UHF mode for receiving a signal having a frequency of UHF band, said tuner integrated circuit comprising:

(a) a signal receiver for serially receiving operation switching signals by each of which said VHF-L band, said VHF-H band, said UHF band, or none of them is selected;

(b) a data converter for converting said operation switching signals serially received in said signal receiver into parallel signals;

(c) a CMOS AND gate for logically multiplying inverted outputs transmitted from said data converter; and (d) a switching buffer for switching a mode of said television tuner between said UHF and VHF modes in accordance with an output transmitted from said CMOS AND gate.

13. The tuner integrated circuit as set forth in claim 12, further comprising a data latch circuit for retaining said parallel signals therein.

14. The tuner integrated circuit as set forth in claim 13, wherein each of said operation switching signals includes at least four-bit data each of which is indicative of whether said VHF-L band, said VHF-H band, said UHF band, or none of them is selected, and wherein said data latch circuit includes at least four flip-flop circuits.

15. The tuner integrated circuit as set forth in claim 14, wherein inverted outputs transmitted from first and second flip-flop circuits among said flip-flop circuits are logically multiplied by said CMOS AND gate.

16. A tuner integrated circuit to be used for a television tuner including VHF mode for receiving a signal having a frequency of VHF-L and VHF-H bands, and UHF mode for receiving a signal having a frequency of UHF band, said tuner integrated circuit comprising:

(a) a signal receiver for serially receiving operation switching signals each including at least four-bit data each of which is indicative of whether said VHF-L band, said VHF-H band, said UHF band, or none of them is selected;

(b) a data converter for converting said operation switching signals serially received in said signal receiver into parallel signals;

(c) a data latch circuit including at least four flip-flop circuits for retaining said parallel signals therein;

(d) a first inverter for inverting a normal output transmitted from a first flip-flop circuit among said flip-flop circuits;

(e) a second inverter for inverting a normal output transmitted from a second flip-flop circuit among said flip-flop circuits;

(f) a CMOS AND gate for logically multiplying outputs transmitted from said first and second inverters; and (g) a switching buffer for switching a mode of said television tuner between said UHF and VHF modes in accordance with an output transmitted from said CMOS AND gate.

17. A tuner integrated circuit to be used for a television tuner including VHF mode for receiving a signal having a frequency of VHF-L and VHF-H bands, and UHF mode for receiving a signal having a frequency of UHF band, said tuner integrated circuit comprising:

(a) a signal receiver for serially receiving operation switching signals by each of which said VHF-L band, said VHF-H band, said UHF band, or none of them is selected;

(b) a data converter for converting said operation switching signals serially received in said signal receiver into parallel signals;

(c) a CMOS NOR gate for making neither-nor operation of normal outputs transmitted from said data converter; and (d) a switching buffer for switching a mode of said television tuner between said UHF and VHF modes in accordance with an output transmitted from said CMOS NOR gate.

18. The tuner integrated circuit as set forth in claim 17, further comprising a data latch circuit for retaining said parallel signals therein.

19. The tuner integrated circuit as set forth in claim 18, wherein each of said operation switching signals includes at least four-bit data each of which is indicative of whether said VHF-L band, said VHF-H band, said UHF band, or none of them is selected, and wherein said data latch circuit includes at least four flip-flop circuits.

20. The tuner integrated circuit as set forth in claim 19, wherein said neither-nor operation by said CMOS NOR gate is made for normal outputs transmitted from first and second flip-flop circuits among said flip-flop circuits.

21. A television tuner comprising:

(a) a tuner integrated circuit to be used for a television tuner including VHF mode for receiving a signal having a frequency of VHF-L and VHF-H bands, and UHF mode for receiving a signal having a frequency of UHF band;

(b) a first signal receiver for receiving signals having frequencies of VHF-L and VHF-H bands;

(c) a second signal receiver for receiving signals having a frequency of UHF band; and (d) a driver for selectively driving one of said first and second signal receivers in accordance with an output transmitted from said tuner integrated circuit, said tuner integrated circuit comprising:

(a-1) a signal receiver for serially receiving operation switching signals by each of which said VHF-L band, said VHF-H band, said UHF band, or none of them is selected;

(a-2) a data converter for converting said operation switching signals serially received in said signal receiver into parallel signals;

(a-3) a logical multiplier for logically multiplying binary data about said VHF-L and VHF-H bands, represented by said operation switching signals; and (a-4) a switching buffer for switching a mode of said television tuner between said UHF and VHF modes in accordance with a logical product provided by said logical multiplier.

22. A television tuner comprising:
(a) a tuner integrated circuit to be used for a television tuner including VHF mode for receiving a signal having a frequency of VHF-L and VHF-H bands, and UHF mode for receiving a signal having a frequency of UHF band;
(b) a first signal receiver for receiving signals having frequencies of VHF-L and VHF-H bands;
(c) a second signal receiver for receiving signals having a frequency of UHF band; and
(d) a driver for selectively driving one of said first and second signal receivers in accordance with an output transmitted from said tuner integrated circuit,
said tuner integrated circuit comprising:
 (a-1) a signal receiver for serially receiving operation switching signals by each of which said VHF-L band, said VHF-H band, said UHF band, or none of them is selected;
 (a-2) a data converter for converting said operation switching signals serially received in said signal receiver into parallel signals;
 (a-3) a wired AND for logically multiplying inverted outputs transmitted from said data converter;
 (a-4) a first integrated injection logic gate for inverting a logical product transmitted from said wired AND;
 (a-5) a second integrated injection logic gate for inverting data transmitted from said first integrated injection logic gate; and
 (a-6) a switching buffer for switching a mode of said television tuner between said UHF and VHF modes in accordance with an output transmitted from said second integrated injection logic gate.

23. A television tuner comprising:
(a) a tuner integrated circuit to be used for a television tuner including VHF mode for receiving a signal having a frequency of VHF-L and VHF-H bands, and UHF mode for receiving a signal having a frequency of UHF band;
(b) a first signal receiver for receiving signals having frequencies of VHF-L and VHF-H bands;
(c) a second signal receiver for receiving signals having a frequency of UHF band; and
(d) a driver for selectively driving one of said first and second signal receivers in accordance with an output transmitted from said tuner integrated circuit,
said tuner integrated circuit comprising:
 (a-1) a signal receiver for serially receiving operation switching signals each including at least four-bit data each of which is indicative of whether said VHF-L band, said VHF-H band, said UHF band, or none of them is selected;
 (a-2) a data converter for converting said operation switching signals serially received in said signal receiver into parallel signals;
 (a-3) a data latch circuit including at least four flip-flop circuits for retaining said parallel signals therein;
 (a-4) a first integrated injection logic gate for inverting a normal output transmitted from a first flip-flop circuit among said flip-flop circuits;
 (a-5) a second integrated injection logic gate for inverting a normal output transmitted from a second flip-flop circuit among said flip-flop circuits;
 (a-6) a wired AND for logically multiplying outputs transmitted from said first and second integrated injection logic gates;
 (a-7) a third integrated injection logic gate for inverting a logical product transmitted from said wired AND;
 (a-8) a fourth integrated injection logic gate for inverting an output transmitted from said third integrated injection logic gate; and
 (a-9) a switching buffer for switching a mode of said television tuner between said UHF and VHF modes in accordance with an output transmitted from said fourth integrated injection logic gate.

24. A television tuner comprising:
(a) a tuner integrated circuit to be used for a television tuner including VHF mode for receiving a signal having a frequency of VHF-L and VHF-H bands, and UHF mode for receiving a signal having a frequency of UHF band;
(b) a first signal receiver for receiving signals having frequencies of VHF-L and VHF-H bands;
(c) a second signal receiver for receiving signals having a frequency of UHF band; and
(d) a driver for selectively driving one of said first and second signal receivers in accordance with an output transmitted from said tuner integrated circuit, said tuner integrated circuit comprising:
 (a-1) a signal receiver for serially receiving operation switching signals by each of which said VHF-L band, said VHF-H band, said UHF band, or none of them is selected;
 (a-2) a data converter for converting said operation switching signals serially received in said signal receiver into parallel signals;
 (a-3) a CMOS AND gate for logically multiplying inverted outputs transmitted from said data converter; and
 (a-4) a switching buffer for switching a mode of said television tuner between said UHF and VHF modes in accordance with an output transmitted from said CMOS AND gate.

25. A television tuner comprising:
(a) a tuner integrated circuit to be used for a television tuner including VHF mode for receiving a signal having a frequency of VHF-L and VHF-H bands, and UHF mode for receiving a signal having a frequency of UHF band;
(b) a first signal receiver for receiving signals having frequencies of VHF-L and VHF-H bands;
(c) a second signal receiver for receiving signals having a frequency of UHF band; and
(d) a driver for selectively driving one of said first and second signal receivers in accordance with an output transmitted from said tuner integrated circuit, said tuner integrated circuit comprising:
 (a-1) a signal receiver for serially receiving operation switching signals each including at least four-bit data each of which is indicative of whether said VHF-L band, said VHF-H band, said UHF band, or none of them is selected;
 (a-2) a data converter for converting said operation switching signals serially received in said signal receiver into parallel signals;
 (a-3) a data latch circuit including at least four flip-flop circuits for retaining said parallel signals therein;
 (a-4) a first inverter for inverting a normal output transmitted from a first flip-flop circuit among said flip-flop circuits;
 (a-5) a second inverter for inverting a normal output transmitted from a second flip-flop circuit among said flip-flop circuits;

(a-6) a CMOS AND gate for logically multiplying outputs transmitted from said first and second inverters; and (a-7) a switching buffer for switching a mode of said television tuner between said UHF and VHF modes in accordance with an output transmitted from said CMOS AND gate.

26. A television tuner comprising:

(a) a tuner integrated circuit to be used for a television tuner including VHF mode for receiving a signal having a frequency of VHF-L and VHF-H bands, and UHF mode for receiving a signal having a frequency of UHF band;

(b) a first signal receiver for receiving signals having frequencies of VHF-L and VHF-H bands;

(c) a second signal receiver for receiving signals having a frequency of UHF band; and (d) a driver for selectively driving one of said first and second signal receivers in accordance with an output transmitted from said tuner integrated circuit, said tuner integrated circuit comprising:

(a-1) a signal receiver for serially receiving operation switching signals by each of which said VHF-L band, said VHF-H band, said UHF band, or none of them is selected;

(a-2) a data converter for converting said operation switching signals serially received in said signal receiver into parallel signals;

(a-3) a CMOS NOR gate for making neither-nor operation of normal outputs transmitted from said data converter; and (a-4) a switching buffer for switching a mode of said television tuner between said UHF and VHF modes in accordance with an output transmitted from said CMOS NOR gate.

27. A method of controlling a television tuner including a first signal receiver receiving signals having frequencies of VHF-L and VHF-H bands, and a second signal receiver receiving a signal having a frequency of UHF band, comprising the steps of:

(a) receiving a serial operation switching signal by which said VHF-L band, said VHF-H band, said UHF band, or none of them is selected;

(b) converting said serial signal into a parallel signal;

(c) performing at least one logic operation on said parallel signal to determine when none of said VHF-L and VHF-H bands is selected; and (d) driving said second signal receiver from the said logic operation and pausing said first signal receiver when none of said VHF-L and VHF-H bands is selected by said operation switching signal.

28. A method of controlling a television tuner including a first signal receiver receiving signals having frequencies of VHF-L and VHF-H bands, and a second signal receiver receiving a signal having a frequency of UHF band, comprising:

(a) receiving a serial operation switching signal by which said VHF-L band, said VHF-H band, said UHF band, or none of them is selected, and converting said serial switching signal into a corresponding parallel format;

(b) driving said second signal receiver and pausing said first signal receiver when a logic operation determines from said parallel format that none of said VHF-L and VHF-H bands is selected by said operation switching signal; and (c) driving said first signal receiver and pausing said second signal receiver when a logic operation determines from said parallel format that one of said VHF-L and VHF-H bands is selected by said operation switching signal.

29. A method of controlling a television tuner including VHF mode for receiving a signal having a frequency of VHF-L and VHF-H bands, and UHF mode for receiving a signal having a frequency of UHF band, said method comprising the steps of:

(a) receiving an operation switching signal by which said VHF-L band, said VHF-H band, said UHF band, or none of them is selected;

(b) making a logical product of binary data about said VHF-L and VHF-H bands, represented by said operation switching signal; and (c) switching a mode of said television tuner between said UHF and VHF modes in accordance with said logical product.

30. A recording medium readable by a computer, storing a program therein for causing a computer to act as a television tuner, said television tuner comprising:

(a) a first signal receiver for receiving signals having frequencies of VHF-L and VHF-H bands;

(b) a second signal receiver for receiving signals having a frequency of UHF band;

(c) a third signal receiver for receiving in serial format operation switching signals by each of which said VHF-L band, said VHF-H band, said UHF band, or none of them is selected;

(d) a convertor for said serial format into a corresponding parallel format;

(e) at least one logic operation for detecting from said parallel format that none of said VHF-L and VHF-H bands is selected; and (f) a driver for driving said second signal receiver when said detector detects none of said VHF-L and VHF-H bands is selected.

31. A recording medium readable by a computer, storing a program therein for causing a computer to act as a television tuner, said television tuner comprising:

(a) a first amplifier for amplifying received signals having frequencies of VHF-L and VHF-H bands;

(b) a first converter for converting a frequency of said received signals having been amplified by said first amplifier;

(c) a second amplifier for amplifying a received signal having a frequency of UHF band;

(d) a second converter for converting a frequency of said received signal having been amplified by said second amplifier;

(e) a signal transmitter for transmitting in serial format an operation switching signal by which said VHF-L band, said VHF-H band, said UHF band, or none of them is selected;

(f) a series-to-parallel converter to convert said series format into a corresponding parallel format;

(g) a logic circuit using at least one logic operation and receiving said parallel format for detecting that none of said VHF-L and VHF-H bands is selected; and (h) a driver for driving said second amplifier and pausing said first amplifier when said detector detects that none of said VHF-L and VHF-H bands is selected, and pausing said second amplifier and driving said first amplifier when said detector detects that one of said VHF-L and VHF-H bands is selected.

32. A recording medium readable by a computer, storing a program therein for causing a computer to act as a television tuner, said television tuner comprising:
   (a) a tuner integrated circuit to be used for a television tuner including VHF mode for receiving a signal having a frequency of VHF-L and VHF-H bands, and UHF mode for receiving a signal having a frequency of UHF band;
   (b) a first signal receiver for receiving signals having frequencies of VHF-L and VHF-H bands;
   (c) a second signal receiver for receiving signals having a frequency of UHF band; and
   (d) a driver for selectively driving one of said first and second signal receivers in accordance with an output transmitted from said tuner integrated circuit, said tuner integrated circuit comprising:
      (a-1) a signal receiver for serially receiving operation switching signals by each of which said VHF-L band, said VHF-H band, said UHF band, or none of them is selected;
      (a-2) a data converter for converting said operation switching signals serially received in said signal receiver into parallel signals;
      (a-3) a logical multiplier for logically multiplying binary data about said VHF-L and VHF-H bands, represented by said operation switching signals; and
      (a-4) a switching buffer for switching a mode of said television tuner between said UHF and VHF modes in accordance with a logical product provided by said logical multiplier.

33. A recording medium readable by a computer, storing a program therein for causing a computer to act as a television tuner, said television tuner comprising:
   (a) a tuner integrated circuit to be used for a television tuner including VHF mode for receiving a signal having a frequency of VHF-L and VHF-H bands, and UHF mode for receiving a signal having a frequency of UHF band;
   (b) a first signal receiver for receiving signals having frequencies of VHF-L and VHF-H bands;
   (c) a second signal receiver for receiving signals having a frequency of UHF band; and
   (d) a driver for selectively driving one of said first and second signal receivers in accordance with an output transmitted from said tuner integrated circuit,
   said tuner integrated circuit comprising:
      (a-1) a signal receiver for serially receiving operation switching signals by each of which said VHF-L band, said VHF-H band, said UHF band, or none of them is selected;
      (a-2) a data converter for converting said operation switching signals serially received in said signal receiver into parallel signals;
      (a-3) a wired AND for logically multiplying inverted outputs transmitted from said data converter;
      (a-4) a first integrated injection logic gate for inverting a logical product transmitted from said wired AND;
      (a-5) a second integrated injection logic gate for inverting data transmitted from said first integrated injection logic gate; and
      (a-6) a switching buffer for switching a mode of said television tuner between said UHF and VHF modes in accordance with an output transmitted from said second integrated injection logic gate.

34. A recording medium readable by a computer, storing a program therein for causing a computer to act as a television tuner, said television tuner comprising:
   (a) a tuner integrated circuit to be used for a television tuner including VHF mode for receiving a signal having a frequency of VHF-L and VHF-H bands, and UHF mode for receiving a signal having a frequency of UHF band;
   (b) a first signal receiver for receiving signals having frequencies of VHF-L and VHF-H bands;
   (c) a second signal receiver for receiving signals having a frequency of UHF band; and
   (d) a driver for selectively driving one of said first and second signal receivers in accordance with an output transmitted from said tuner integrated circuit, said tuner integrated circuit comprising:
      (a-1) a signal receiver for serially receiving operation switching signals each including at least four-bit data each of which is indicative of whether said VHF-L band, said VHF-H band, said UHF band, or none of them is selected;
      (a-2) a data converter for converting said operation switching signals serially received in said signal receiver into parallel signals;
      (a-3) a data latch circuit including at least four flip-flop circuits for retaining said parallel signals therein;
      (a-4) a first integrated injection logic gate for inverting a normal output transmitted from a first flip-flop circuit among said flip-flop circuits;
      (a-5) a second integrated injection logic gate for inverting a normal output transmitted from a second flip-flop circuit among said flip-flop circuits;
      (a-6) a wired AND for logically multiplying outputs transmitted from said first and second integrated injection logic gates;
      (a-7) a third integrated injection logic gate for inverting a logical product transmitted from said wired AND;
      (a-8) a fourth integrated injection logic gate for inverting an output transmitted from said third integrated injection logic gate; and
      (a-9) a switching buffer for switching a mode of said television tuner between said UHF and VHF modes in accordance with an output transmitted from said fourth integrated injection logic gate.

35. A recording medium readable by a computer, storing a program therein for causing a computer to act as a television tuner, said television tuner comprising:
   (a) a tuner integrated circuit to be used for a television tuner including VHF mode for receiving a signal having a frequency of VHF-L and VHF-H bands, and UHF mode for receiving a signal having a frequency of UHF band;
   (b) a first signal receiver for receiving signals having frequencies of VHF-L and VHF-H bands;
   (c) a second signal receiver for receiving signals having a frequency of UHF band; and
   (d) a driver for selectively driving one of said first and second signal receivers in accordance with an output transmitted from said tuner integrated circuit, said tuner integrated circuit comprising:
      (a-1) a signal receiver for serially receiving operation switching signals by each of which said VHF-L band, said VHF-H band, said UHF band, or none of them is selected;
      (a-2) a data converter for converting said operation switching signals serially received in said signal receiver into parallel signals;

(a-3) a CMOS AND gate for logically multiplying inverted outputs transmitted from said data converter; and (a-4) a switching buffer for switching a mode of said television tuner between said UHF and VHF modes in accordance with an output transmitted from said CMOS AND gate.

36. A recording medium readable by a computer, storing a program therein for causing a computer to act as a television tuner, said television tuner comprising:

(a) a tuner integrated circuit to be used for a television tuner including VHF mode for receiving a signal having a frequency of VHF-L and VHF-H bands, and UHF mode for receiving a signal having a frequency of UHF band;

(b) a first signal receiver for receiving signals having frequencies of VHF-L and VHF-H bands;

(c) a second signal receiver for receiving signals having a frequency of UHF band; and (d) a driver for selectively driving one of said first and second signal receivers in accordance with an output transmitted from said tuner integrated circuit, said tuner integrated circuit comprising:

(a-1) a signal receiver for serially receiving operation switching signals each including at least four-bit data each of which is indicative of whether said VHF-L band, said VHF-H band, said UHF band, or none of them is selected;

(a-2) a data converter for converting said operation switching signals serially received in said signal receiver into parallel signals;

(a-3) a data latch circuit including at least four flip-flop circuits for retaining said parallel signals therein;

(a-4) a first inverter for inverting a normal output transmitted from a first flip-flop circuit among said flip-flop circuits;

(a-5) a second inverter for inverting a normal output transmitted from a second flip-flop circuit among said flip-flop circuits;

(a-6) a CMOS AND gate for logically multiplying outputs transmitted from said first and second inverters; and (a-7) a switching buffer for switching a mode of said television tuner between said UHF and VHF modes in accordance with an output transmitted from said CMOS AND gate.

37. A recording medium readable by a computer, storing a program therein for causing a computer to act as a television tuner, said television tuner comprising:

(a) a tuner integrated circuit to be used for a television tuner including VHF mode for receiving a signal having a frequency of VHF-L and VHF-H bands, and UHF mode for receiving a signal having a frequency of UHF band;

(b) a first signal receiver for receiving signals having frequencies of VHF-L and VHF-H bands;

(c) a second signal receiver for receiving signals having a frequency of UHF band; and (d) a driver for selectively driving one of said first and second signal receivers in accordance with an output transmitted from said tuner integrated circuit, said tuner integrated circuit comprising:

(a-1) a signal receiver for serially receiving operation switching signals by each of which said VHF-L band, said VHF-H band, said UHF band, or none of them is selected;

(a-2) a data converter for converting said operation switching signals serially received in said signal receiver into parallel signals;

(a-3) a CMOS NOR gate for making neither-nor operation of normal outputs transmitted from said data converter; and (a-4) a switching buffer for switching a mode of said television tuner between said UHF and VHF modes in accordance with an output transmitted from said CMOS NOR gate.

* * * * *